(12) United States Patent
Haba et al.

(10) Patent No.: US 12,451,439 B2
(45) Date of Patent: *Oct. 21, 2025

(54) BONDED STRUCTURE INCLUDING AN OBSTRUCTIVE ELEMENT DIRECTLY BONDED TO A SEMICONDUCTOR ELEMENT WITHOUT AN ADHESIVE

(71) Applicant: Adeia Semiconductor Bonding Technologies Inc., San Jose, CA (US)

(72) Inventors: Belgacem Haba, Saratoga, CA (US); Javier A. DeLaCruz, San Jose, CA (US); Rajesh Katkar, Milpitas, CA (US); Arkalgud R. Sitaram, Cupertino, CA (US)

(73) Assignee: Adeia Semiconductor Bonding Technologies Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/087,705

(22) Filed: Dec. 22, 2022

(65) Prior Publication Data

US 2023/0317628 A1 Oct. 5, 2023

Related U.S. Application Data

(63) Continuation of application No. 16/844,932, filed on Apr. 9, 2020, now Pat. No. 11,610,846.
(Continued)

(51) Int. Cl.
*H01L 23/552* (2006.01)
*H01L 23/00* (2006.01)

(52) U.S. Cl.
CPC .......... *H01L 23/552* (2013.01); *H01L 23/573* (2013.01); *H01L 24/05* (2013.01);
(Continued)

(58) Field of Classification Search
CPC .......... H01L 23/552; H01L 224/83896; H01L 24/05; H01L 24/29; H01L 24/83;
(Continued)

(56) References Cited

U.S. PATENT DOCUMENTS 5,369,299 A 11/1994 Bryne
5,451,547 A 9/1995 Himi et al.
(Continued)

FOREIGN PATENT DOCUMENTS

CN 105008134 A 10/2015
CN 107946249 A 4/2018
(Continued)

OTHER PUBLICATIONS

Amirfeiz et al., "Formation of silicon structures by plasma-activated wafer bonding," Journal of The Electrochemical Society, 2000, vol. 147, No. 7, pp. 2693-2698.
(Continued)

*Primary Examiner* — Khiem D Nguyen
(74) *Attorney, Agent, or Firm* — Knobbe, Martens, Olson & Bear, LLP

(57) ABSTRACT

A bonded structure is disclosed. The bonded structure can include a semiconductor element comprising active circuitry and a first bonding layer. The bonded structure can include a protective element directly bonded to the semiconductor element without an adhesive along a bonding interface. The protective element can include an obstructive material disposed over the active circuitry and a second bonding layer on the obstructive material. The second bonding layer can be directly bonded to the first bonding layer without an adhesive. The obstructive material can be configured to obstruct external access to the active circuitry.

20 Claims, 13 Drawing Sheets

Related U.S. Application Data

(60) Provisional application No. 62/953,058, filed on Dec. 23, 2019, provisional application No. 62/833,491, filed on Apr. 12, 2019.

(52) U.S. Cl.
CPC .............. H01L 24/29 (2013.01); H01L 24/83 (2013.01); *H01L 2224/83896* (2013.01)

(58) Field of Classification Search
CPC ................... H01L 23/57; H01L 23/573; H01L 2224/80896; H01L 2924/00012
See application file for complete search history.

(56) References Cited

U.S. PATENT DOCUMENTS

| | | |
|---|---|---|
| 5,753,536 A | 5/1998 | Sugiyama et al. |
| 5,771,555 A | 6/1998 | Eda et al. |
| 6,080,640 A | 6/2000 | Gardner et al. |
| 6,180,496 B1 | 1/2001 | Farrens et al. |
| 6,423,640 B1 | 7/2002 | Lee et al. |
| 6,465,892 B1 | 10/2002 | Suga |
| 6,645,828 B1 | 11/2003 | Farrens et al. |
| 6,887,769 B2 | 5/2005 | Kellar et al. |
| 6,908,027 B2 | 6/2005 | Tolchinsky et al. |
| 6,908,832 B2 | 6/2005 | Farrens et al. |
| 7,045,453 B2 | 5/2006 | Canaperi et al. |
| 7,105,980 B2 | 9/2006 | Abbott et al. |
| 7,193,423 B1 | 3/2007 | Dalton et al. |
| 7,489,013 B1 | 2/2009 | Chubin et al. |
| 7,750,488 B2 | 7/2010 | Patti et al. |
| 7,803,693 B2 | 9/2010 | Trezza |
| 8,183,127 B2 | 5/2012 | Patti et al. |
| 8,349,635 B1 | 1/2013 | Gan et al. |
| 8,377,798 B2 | 2/2013 | Peng et al. |
| 8,441,131 B2 | 5/2013 | Ryan |
| 8,476,165 B2 | 7/2013 | Trickett et al. |
| 8,482,132 B2 | 7/2013 | Yang et al. |
| 8,501,537 B2 | 8/2013 | Sadaka et al. |
| 8,524,533 B2 | 9/2013 | Tong et al. |
| 8,581,108 B1 | 11/2013 | Boone et al. |
| 8,620,164 B2 | 12/2013 | Heck et al. |
| 8,647,987 B2 | 2/2014 | Yang et al. |
| 8,697,493 B2 | 4/2014 | Sadaka |
| 8,716,105 B2 | 5/2014 | Sadaka et al. |
| 8,802,538 B1 | 8/2014 | Liu |
| 8,809,123 B2 | 8/2014 | Liu et al. |
| 8,841,002 B2 | 9/2014 | Tong |
| 9,087,851 B2 | 7/2015 | Afzali-Ardakani et al. |
| 9,093,350 B2 | 7/2015 | Endo et al. |
| 9,142,517 B2 | 9/2015 | Liu et al. |
| 9,171,756 B2 | 10/2015 | Enquist et al. |
| 9,184,125 B2 | 11/2015 | Enquist et al. |
| 9,196,555 B1 | 11/2015 | Lower et al. |
| 9,224,704 B2 * | 12/2015 | Landru .................... H01L 25/50 |
| 9,230,941 B2 | 1/2016 | Chen et al. |
| 9,246,311 B1 | 1/2016 | Raring et al. |
| 9,257,399 B2 * | 2/2016 | Kuang ................. H01L 23/5385 |
| 9,299,736 B2 | 3/2016 | Chen et al. |
| 9,312,229 B2 | 4/2016 | Chen et al. |
| 9,331,149 B2 * | 5/2016 | Tong ................. H01L 21/31105 |
| 9,337,235 B2 | 5/2016 | Chen et al. |
| 9,385,024 B2 | 7/2016 | Tong et al. |
| 9,394,161 B2 | 7/2016 | Cheng et al. |
| 9,431,368 B2 | 8/2016 | Enquist et al. |
| 9,437,572 B2 | 9/2016 | Chen et al. |
| 9,443,796 B2 | 9/2016 | Chou et al. |
| 9,455,233 B1 | 9/2016 | Bhooshan et al. |
| 9,461,007 B2 | 10/2016 | Chun et al. |
| 9,496,239 B1 * | 11/2016 | Edelstein .............. H01L 21/187 |
| 9,536,848 B2 | 1/2017 | England et al. |
| 9,553,056 B1 | 1/2017 | Afzali-Ardakani et al. |
| 9,559,081 B1 | 1/2017 | Lai et al. |
| 9,620,481 B2 | 4/2017 | Edelstein et al. |
| 9,656,852 B2 | 5/2017 | Cheng et al. |
| 9,723,716 B2 | 8/2017 | Meinhold |
| 9,728,521 B2 | 8/2017 | Tsai et al. |
| 9,741,620 B2 | 8/2017 | Uzoh et al. |
| 9,799,587 B2 | 10/2017 | Fujii et al. |
| 9,852,988 B2 | 12/2017 | Enquist et al. |
| 9,893,004 B2 | 2/2018 | Yazdani |
| 9,899,442 B2 | 2/2018 | Katkar |
| 9,929,050 B2 | 3/2018 | Lin |
| 9,941,241 B2 * | 4/2018 | Edelstein ................ H01L 24/05 |
| 9,941,243 B2 | 4/2018 | Kim et al. |
| 9,953,941 B2 | 4/2018 | Enquist |
| 9,960,142 B2 | 5/2018 | Chen et al. |
| 10,002,844 B1 | 6/2018 | Wang et al. |
| 10,014,429 B2 * | 7/2018 | Newman .......... H01L 31/03042 |
| 10,026,605 B2 | 7/2018 | Doub et al. |
| 10,026,716 B2 | 7/2018 | Yu et al. |
| 10,075,657 B2 | 9/2018 | Fahim et al. |
| 10,204,893 B2 | 2/2019 | Uzoh et al. |
| 10,269,708 B2 | 4/2019 | Enquist et al. |
| 10,269,756 B2 | 4/2019 | Uzoh |
| 10,276,619 B2 | 4/2019 | Kao et al. |
| 10,276,909 B2 | 4/2019 | Huang et al. |
| 10,418,277 B2 * | 9/2019 | Cheng ............... H01L 21/76852 |
| 10,437,012 B1 | 10/2019 | Gurin |
| 10,446,456 B2 | 10/2019 | Shen et al. |
| 10,446,487 B2 * | 10/2019 | Huang ................ H01L 23/5223 |
| 10,446,532 B2 | 10/2019 | Uzoh et al. |
| 10,522,499 B2 | 12/2019 | Enquist et al. |
| 10,707,087 B2 | 7/2020 | Uzoh et al. |
| 10,727,219 B2 | 7/2020 | Uzoh et al. |
| 10,790,262 B2 | 9/2020 | Uzoh et al. |
| 10,840,135 B2 | 11/2020 | Uzoh |
| 10,840,205 B2 | 11/2020 | Fountain, Jr. et al. |
| 10,854,578 B2 | 12/2020 | Morein |
| 10,879,212 B2 | 12/2020 | Uzoh et al. |
| 10,886,177 B2 | 1/2021 | DeLaCruz et al. |
| 10,886,255 B2 | 1/2021 | Hong et al. |
| 10,892,246 B2 | 1/2021 | Uzoh |
| 10,923,408 B2 | 2/2021 | Huang et al. |
| 10,923,413 B2 | 2/2021 | DeLaCruz |
| 10,950,547 B2 | 3/2021 | Mohammed et al. |
| 10,964,664 B2 | 3/2021 | Mandalapu et al. |
| 10,985,133 B2 | 4/2021 | Uzoh |
| 10,991,804 B2 | 4/2021 | DeLaCruz et al. |
| 10,998,292 B2 | 5/2021 | Lee et al. |
| 11,011,503 B2 | 5/2021 | Wang et al. |
| 11,031,285 B2 | 6/2021 | Katkar et al. |
| 11,056,348 B2 | 7/2021 | Theil |
| 11,088,099 B2 | 8/2021 | Katkar et al. |
| 11,127,738 B2 | 9/2021 | DeLaCruz et al. |
| 11,158,606 B2 | 10/2021 | Gao et al. |
| 11,171,117 B2 | 11/2021 | Gao et al. |
| 11,176,450 B2 | 11/2021 | Teig et al. |
| 11,205,625 B2 | 12/2021 | DeLaCruz et al. |
| 11,256,004 B2 | 2/2022 | Haba et al. |
| 11,264,357 B1 | 3/2022 | DeLaCruz et al. |
| 11,276,676 B2 | 3/2022 | Enquist et al. |
| 11,329,034 B2 | 5/2022 | Tao et al. |
| 11,348,898 B2 | 5/2022 | DeLaCruz et al. |
| 11,355,443 B2 | 6/2022 | Huang et al. |
| 11,373,963 B2 | 6/2022 | DeLaCruz et al. |
| 11,385,278 B2 | 7/2022 | DeLaCruz et al. |
| 11,387,196 B2 | 7/2022 | Kang et al. |
| 11,610,846 B2 * | 3/2023 | Haba ....................... H01L 24/29 |
| 11,728,287 B2 | 8/2023 | DeLaCruz et al. |
| 11,848,284 B2 | 12/2023 | DeLaCruz et al. |
| 12,174,246 B2 | 12/2024 | DeLaCruz et al. |
| 12,176,303 B2 | 12/2024 | DeLaCruz et al. |
| 12,300,634 B2 | 5/2025 | Haba et al. |
| 2002/0003307 A1 | 1/2002 | Suga |
| 2002/0096744 A1 | 7/2002 | Chow et al. |
| 2004/0084414 A1 | 5/2004 | Sakai et al. |
| 2004/0188819 A1 | 9/2004 | Farnworth et al. |
| 2006/0057945 A1 | 3/2006 | Hsu et al. |
| 2007/0030022 A1 * | 2/2007 | Kash .................... H01L 27/0207 |
| | | 257/E27.009 |
| 2007/0111386 A1 | 5/2007 | Kim et al. |
| 2008/0006938 A1 | 1/2008 | Patti et al. |

(56) References Cited

U.S. PATENT DOCUMENTS

| | | |
|---|---|---|
| 2008/0088996 A1 | 4/2008 | Bonvalot et al. |
| 2008/0251906 A1 | 10/2008 | Eaton et al. |
| 2009/0072343 A1 | 3/2009 | Ohnuma et al. |
| 2009/0246355 A9 | 10/2009 | Lower et al. |
| 2010/0032776 A1 | 2/2010 | Pham et al. |
| 2010/0171202 A1 | 7/2010 | Tian et al. |
| 2010/0190334 A1 | 7/2010 | Lee |
| 2010/0216294 A1 | 8/2010 | Rabarot et al. |
| 2010/0314149 A1 | 12/2010 | Gerrish et al. |
| 2010/0315108 A1 | 12/2010 | Fornara et al. |
| 2011/0090658 A1 | 4/2011 | Adams et al. |
| 2012/0256305 A1 | 10/2012 | Kaufmann et al. |
| 2012/0313176 A1 | 12/2012 | Frohberg et al. |
| 2013/0328174 A1 | 12/2013 | La Tulipe, Jr. et al. |
| 2014/0035136 A1 | 2/2014 | Buer et al. |
| 2014/0175655 A1* | 6/2014 | Chen ............... H01L 24/11 228/172 |
| 2014/0346685 A1 | 11/2014 | Afzali-Ardakani et al. |
| 2014/0349448 A1 | 11/2014 | Afzali-Ardakani et al. |
| 2014/0353828 A1 | 12/2014 | Edelstein et al. |
| 2015/0064498 A1 | 3/2015 | Tong |
| 2015/0262976 A1 | 9/2015 | Edelstein et al. |
| 2016/0132698 A1 | 5/2016 | Miyajima |
| 2016/0315055 A1 | 10/2016 | Vogt et al. |
| 2016/0343682 A1 | 11/2016 | Kawasaki |
| 2016/0377689 A1 | 12/2016 | Babulano et al. |
| 2017/0117431 A1 | 4/2017 | Afzali-Ardakani et al. |
| 2017/0190572 A1* | 7/2017 | Pan ............... H01L 23/3121 |
| 2017/0200756 A1* | 7/2017 | Kao ............... H01L 27/14636 |
| 2017/0244756 A1 | 8/2017 | Bartley et al. |
| 2017/0373024 A1* | 12/2017 | Graf ............... H01L 23/49838 |
| 2018/0061781 A1* | 3/2018 | Petitdidier ......... H01L 23/5226 |
| 2018/0175012 A1 | 6/2018 | Wu et al. |
| 2018/0182639 A1 | 6/2018 | Uzoh et al. |
| 2018/0182666 A1 | 6/2018 | Uzoh et al. |
| 2018/0190580 A1 | 7/2018 | Haba et al. |
| 2018/0190583 A1 | 7/2018 | DeLaCruz et al. |
| 2018/0219038 A1 | 8/2018 | Gambino et al. |
| 2018/0226375 A1 | 8/2018 | Enquist et al. |
| 2018/0273377 A1 | 9/2018 | Katkar et al. |
| 2018/0286805 A1 | 10/2018 | Huang et al. |
| 2018/0308808 A1 | 10/2018 | Kirschner et al. |
| 2018/0323177 A1 | 11/2018 | Yu et al. |
| 2018/0323227 A1 | 11/2018 | Zhang et al. |
| 2018/0331066 A1* | 11/2018 | Uzoh ............... H01L 25/50 |
| 2019/0096741 A1 | 3/2019 | Uzoh et al. |
| 2019/0096842 A1 | 3/2019 | Fountain, Jr. et al. |
| 2019/0115277 A1 | 4/2019 | Yu et al. |
| 2019/0131277 A1 | 5/2019 | Yang et al. |
| 2019/0198407 A1 | 6/2019 | Huang et al. |
| 2019/0198409 A1* | 6/2019 | Katkar ............... H01L 21/3221 |
| 2019/0265411 A1 | 8/2019 | Huang et al. |
| 2019/0333550 A1 | 10/2019 | Fisch |
| 2019/0348336 A1 | 11/2019 | Katkar et al. |
| 2019/0385935 A1 | 12/2019 | Gao et al. |
| 2019/0385966 A1 | 12/2019 | Gao et al. |
| 2020/0013637 A1 | 1/2020 | Haba |
| 2020/0013765 A1 | 1/2020 | Fountain, Jr. et al. |
| 2020/0035641 A1 | 1/2020 | Fountain, Jr. et al. |
| 2020/0075520 A1 | 3/2020 | Gao et al. |
| 2020/0075534 A1 | 3/2020 | Gao et al. |
| 2020/0075553 A1 | 3/2020 | DeLaCruz et al. |
| 2020/0118973 A1 | 4/2020 | Wang et al. |
| 2020/0126906 A1 | 4/2020 | Uzoh et al. |
| 2020/0135698 A1 | 4/2020 | Hong et al. |
| 2020/0194396 A1 | 6/2020 | Uzoh |
| 2020/0227367 A1 | 7/2020 | Haba et al. |
| 2020/0235059 A1 | 7/2020 | Cok et al. |
| 2020/0243380 A1 | 7/2020 | Uzoh et al. |
| 2020/0249324 A1 | 8/2020 | Steinberg et al. |
| 2020/0279821 A1 | 9/2020 | Haba et al. |
| 2020/0294908 A1 | 9/2020 | Haba et al. |
| 2020/0303361 A1 | 9/2020 | Shih |
| 2020/0328162 A1 | 10/2020 | Haba et al. |
| 2020/0328163 A1 | 10/2020 | Best et al. |
| 2020/0328164 A1 | 10/2020 | DeLaCruz et al. |
| 2020/0328165 A1 | 10/2020 | DeLaCruz et al. |
| 2020/0335408 A1 | 10/2020 | Gao et al. |
| 2020/0335450 A1 | 10/2020 | Wang et al. |
| 2020/0371154 A1 | 11/2020 | DeLaCruz et al. |
| 2020/0395321 A1 | 12/2020 | Katkar et al. |
| 2020/0411483 A1 | 12/2020 | Uzoh et al. |
| 2021/0043587 A1 | 2/2021 | Lu et al. |
| 2021/0098412 A1 | 4/2021 | Haba et al. |
| 2021/0118864 A1 | 4/2021 | DeLaCruz et al. |
| 2021/0143125 A1 | 5/2021 | DeLaCruz et al. |
| 2021/0181510 A1 | 6/2021 | Katkar et al. |
| 2021/0193603 A1 | 6/2021 | Katkar et al. |
| 2021/0193624 A1 | 6/2021 | DeLaCruz et al. |
| 2021/0193625 A1 | 6/2021 | DeLaCruz et al. |
| 2021/0210439 A1 | 7/2021 | Lim et al. |
| 2021/0242152 A1 | 8/2021 | Fountain, Jr. et al. |
| 2021/0296282 A1 | 9/2021 | Gao et al. |
| 2021/0305202 A1 | 9/2021 | Uzoh et al. |
| 2021/0366820 A1 | 11/2021 | Uzoh |
| 2021/0407941 A1 | 12/2021 | Haba |
| 2022/0077063 A1 | 3/2022 | Haba |
| 2022/0077087 A1 | 3/2022 | Haba |
| 2022/0115329 A1 | 4/2022 | Kantarovsky et al. |
| 2022/0134511 A1 | 5/2022 | Ankersen |
| 2022/0139849 A1 | 5/2022 | DeLaCruz et al. |
| 2022/0139867 A1 | 5/2022 | Uzoh |
| 2022/0139869 A1 | 5/2022 | Gao et al. |
| 2022/0208650 A1 | 6/2022 | Gao et al. |
| 2022/0208702 A1 | 6/2022 | Uzoh |
| 2022/0208723 A1 | 6/2022 | Katkar et al. |
| 2022/0246497 A1 | 8/2022 | Fountain, Jr. et al. |
| 2022/0285303 A1 | 9/2022 | Mirkarimi et al. |
| 2022/0302048 A1 | 9/2022 | DeLaCruz et al. |
| 2022/0319901 A1 | 10/2022 | Suwito et al. |
| 2022/0320035 A1 | 10/2022 | Uzoh et al. |
| 2022/0320036 A1 | 10/2022 | Gao et al. |
| 2022/0373593 A1 | 11/2022 | DeLaCruz et al. |
| 2023/0005850 A1 | 1/2023 | Fountain, Jr. |
| 2023/0019869 A1 | 1/2023 | Mirkarimi et al. |
| 2023/0036441 A1 | 2/2023 | Haba et al. |
| 2023/0067677 A1 | 3/2023 | Lee et al. |
| 2023/0069183 A1 | 3/2023 | Haba |
| 2023/0100032 A1 | 3/2023 | Haba et al. |
| 2023/0115122 A1 | 4/2023 | Uzoh et al. |
| 2023/0122531 A1 | 4/2023 | Uzoh |
| 2023/0123423 A1 | 4/2023 | Gao et al. |
| 2023/0125395 A1 | 4/2023 | Gao et al. |
| 2023/0130259 A1 | 4/2023 | Haba et al. |
| 2023/0132632 A1 | 5/2023 | Katkar et al. |
| 2023/0140107 A1 | 5/2023 | Uzoh et al. |
| 2023/0142680 A1 | 5/2023 | Guevara et al. |
| 2023/0154816 A1 | 5/2023 | Haba et al. |
| 2023/0154828 A1 | 5/2023 | Haba et al. |
| 2023/0187264 A1 | 6/2023 | Uzoh et al. |
| 2023/0187317 A1 | 6/2023 | Uzoh |
| 2023/0187412 A1 | 6/2023 | Gao et al. |
| 2023/0197453 A1 | 6/2023 | Fountain, Jr. et al. |
| 2023/0197496 A1 | 6/2023 | Theil |
| 2023/0197559 A1 | 6/2023 | Haba et al. |
| 2023/0197560 A1 | 6/2023 | Katkar et al. |
| 2023/0197655 A1 | 6/2023 | Theil et al. |
| 2023/0207402 A1 | 6/2023 | Fountain, Jr. et al. |
| 2023/0207437 A1 | 6/2023 | Haba |
| 2023/0207474 A1 | 6/2023 | Uzoh et al. |
| 2023/0207514 A1 | 6/2023 | Gao et al. |
| 2023/0215836 A1 | 7/2023 | Haba et al. |
| 2023/0245950 A1 | 8/2023 | Haba et al. |
| 2023/0268300 A1 | 8/2023 | Uzoh et al. |
| 2023/0299029 A1 | 9/2023 | Theil et al. |
| 2023/0343734 A1 | 10/2023 | Uzoh et al. |
| 2023/0360950 A1 | 11/2023 | Gao |
| 2023/0361074 A1 | 11/2023 | Uzoh et al. |
| 2023/0369136 A1 | 11/2023 | Uzoh et al. |
| 2023/0375613 A1 | 11/2023 | Haba et al. |
| 2024/0055407 A1 | 2/2024 | Workman |
| 2024/0079351 A1 | 3/2024 | DeLaCruz et al. |
| 2024/0079376 A1 | 3/2024 | Suwito et al. |
| 2024/0096823 A1 | 3/2024 | DeLaCruz et al. |

(56) References Cited

U.S. PATENT DOCUMENTS

| | | |
|---|---|---|
| 2024/0105674 A1 | 3/2024 | Uzoh et al. |
| 2024/0170411 A1 | 5/2024 | Chang et al. |
| 2024/0186248 A1 | 6/2024 | Haba et al. |
| 2024/0186268 A1 | 6/2024 | Uzoh et al. |
| 2024/0186269 A1 | 6/2024 | Haba |
| 2024/0203917 A1 | 6/2024 | Katkar et al. |
| 2024/0213191 A1 | 6/2024 | Theil et al. |
| 2024/0213210 A1 | 6/2024 | Haba et al. |
| 2024/0217210 A1 | 7/2024 | Zhao et al. |
| 2024/0222239 A1 | 7/2024 | Gao et al. |
| 2024/0222315 A1 | 7/2024 | Uzoh |
| 2024/0222319 A1 | 7/2024 | Gao et al. |
| 2024/0266255 A1 | 8/2024 | Haba et al. |
| 2024/0298454 A1 | 9/2024 | Haba |
| 2024/0304593 A1 | 9/2024 | Uzoh |
| 2024/0312951 A1 | 9/2024 | Theil et al. |
| 2024/0332184 A1 | 10/2024 | Katkar et al. |
| 2024/0332227 A1 | 10/2024 | Uzoh et al. |
| 2024/0332231 A1 | 10/2024 | Uzoh |
| 2024/0332267 A1 | 10/2024 | Haba et al. |
| 2024/0387419 A1 | 11/2024 | Mrozek et al. |
| 2025/0004197 A1 | 1/2025 | Haba et al. |
| 2025/0006632 A1 | 1/2025 | Chang et al. |
| 2025/0006642 A1 | 1/2025 | Haba et al. |
| 2025/0006674 A1 | 1/2025 | Uzoh et al. |
| 2025/0006679 A1 | 1/2025 | Theil et al. |
| 2025/0006689 A1 | 1/2025 | Uzoh et al. |
| 2025/0054854 A1 | 2/2025 | Katkar et al. |
| 2025/0079364 A1 | 3/2025 | Uzoh et al. |
| 2025/0096191 A1 | 3/2025 | Gao et al. |
| 2025/0112123 A1 | 4/2025 | Katkar et al. |

FOREIGN PATENT DOCUMENTS

| | | | |
|---|---|---|---|
| EP | 0967259 A1 | 12/1999 | |
| EP | 2921314 B1 | 10/2020 | |
| JP | 2002-353416 | 12/2002 | |
| JP | 2005071131 A | 3/2005 | |
| JP | 2010-272622 A | 12/2010 | |
| JP | 2013-033786 A | 2/2013 | |
| JP | 2015193232 A | 11/2015 | |
| JP | 2018-160519 | 10/2018 | |
| KR | 20000006164 A | 1/2000 | |
| WO | WO 2005/043584 A2 | 5/2005 | |
| WO | WO 2006/013507 A1 | 2/2006 | |
| WO | WO 2013/106921 A1 | 7/2013 | |
| WO | WO 2020/034063 A1 | 2/2020 | |

OTHER PUBLICATIONS

Bengtsson et al., "Low temperature bonding," International Conference on Compliant & Alternative Substrate Technology, Sep. 1999, p. 10.
Daneman, "Applying the CMOS Test Flow to MEMS Manufacturing", InvenSense, Inc., accessed on Apr. 5, 2020.
Farrens et al., "Chemical free room temperature wafer to wafer direct bonding," J. Electrochem. Soc., The Electrochemical Society, Inc., Nov. 1995, vol. 142, No. 11, pp. 3949-3955.
Gan, Qing, "Surface activation enhanced low temperature silicon wafer bonding," Dissertation submitted in partial fulfillment of the requirements for the degree of Doctor of Philosophy, Department of Mechanical Engineering and Materials Science, Duke University, Aug. 4, 2000, 192 pages.
Gösele et al., "Semiconductor Wafer Bonding: A flexible approach to materials combinations in microelectronics; micromechanics and optoelectronics," IEEE, 1997, pp. 23-32.
International Search Report and Written Opinion mailed Jul. 29, 2020, in International Application No. PCT/US2020/027732, 2 pages.
International Search Report and Written Opinion mailed Jul. 29, 2020, in International Application No. PCT/US2020/027772, 8 pages.
Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.
Knechtel, J. et al., "3D integration: Another dimension toward hardware security," 2019 IEEE 25th International Symposium on On-Line Testing and Robust System Design, Jul. 2019, 5 pages.
Lohrke, H. et al., "No place to hide: Contactless probing of secret data on FPGAs," International Association for Cryptologic Research 2016, Gierlichs B., Poschmann A. (eds) Cryptographic Hardware and Embedded Systems—CHES 2016, pp. 147-167.
Moriceau, H. et al., "Overview of recent direct wafer bonding advances and applications," Advances in Natural Sciences—Nanoscience and Nanotechnology, 2010, 11 pages.
Nakanishi, H. et al., "Studies on SiO2-SiO2 bonding with hydrofluoric acid. Room temperature and low stress bonding technique for MEMS," Sensors and Actuators, 2000, vol. 79, pp. 237-244.
Non-Final Office Action mailed Apr. 1, 2021, U.S. Appl. No. 16/846,177, 16 pages.
Non-Final Office Action mailed Aug. 26, 2021, U.S. Appl. No. 16/881,621, 20 pages.
Notice of Allowance mailed Aug. 17, 2021, U.S. Appl. No. 16/846,177, 10 pages.
Oberhammer, J. et al., "Sealing of adhesive bonded devices on wafer level," Sensors and Actuators A, 2004, vol. 110, No. 1-3, pp. 407-412, see pp. 407-412, and Figures 1(a)-1(l), 6 pages.
Plobi, A. et al., "Wafer direct bonding: tailoring adhesion between brittle materials," Materials Science and Engineering Review Journal, 1999, R25, 88 pages.
Reiche et al., "The effect of a plasma pretreatment on the Si/Si bonding behaviouir," Electrochemical Society Proceedings, 1998, vol. 97-36, pp. 437-444.
Suga et al., "Bump-less interconnect for next generation system packaging," Electronic Components and Technology Conference, 2001, IEEE, pp. 1003-1008.
Suga, T., "Feasibility of surface activated bonding for ultra-fine pitch interconnection—A new concept of bump-less direct bonding for system level packaging," The University of Tokyo, Research Center for Science and Technology, 2000 Electronic Components and Technology Conference, 2000 IEEE, pp. 702-705.
Wang et al., Probing attacks on integrated circuits: Challenges and research opportunities, IEEE Design & Test, Sep./Oct. 2017, vol. 34, No. 5, pp. 63-71.
Bush, Steve, "Electronica: Automotive power modules from On Semi," ElectronicsWeekly.com, indicating an ONSEMI AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).
Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.
ONSEMI AR0820 image, cross section of a CMOS image sensor product. The part in the image was shipped on Sep. 16, 2021. Applicant makes no representation that the part in the image is identical to the part identified in the separately submitted reference Bush, Nov. 8, 2018, ElectronicsWeekly.com ("Bush article"); however, the imaged part and the part shown in the Bush article share the part number "ONSEMI AR0820."
Sony IMX260 image, a first cross section of Sony product labeled IMX260, showing a hybrid bonded back side illuminated CMOS image sensor with a pad opening for a wire bond. The second image shows a second cross-section with peripheral probe and wire bond pads in the bonded structure. The part in the images was shipped in Apr. 2016. Applicant makes no representation that the part in the images is identical to the part identified in the separately submitted reference Morrison et al. (Tech Insights article dated Apr. 24, 2016), describing and showing a similar sensor product within the Samsung

(56) References Cited

OTHER PUBLICATIONS

Galaxy S7; however the imaged part and the part shown in the Morrison et al. article share the part name "Sony IMX260 image."

* cited by examiner

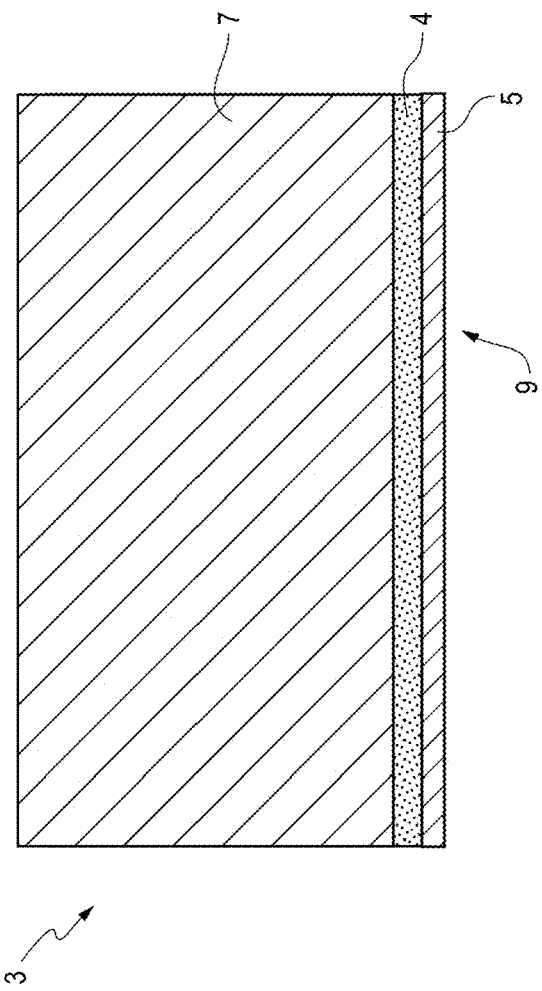
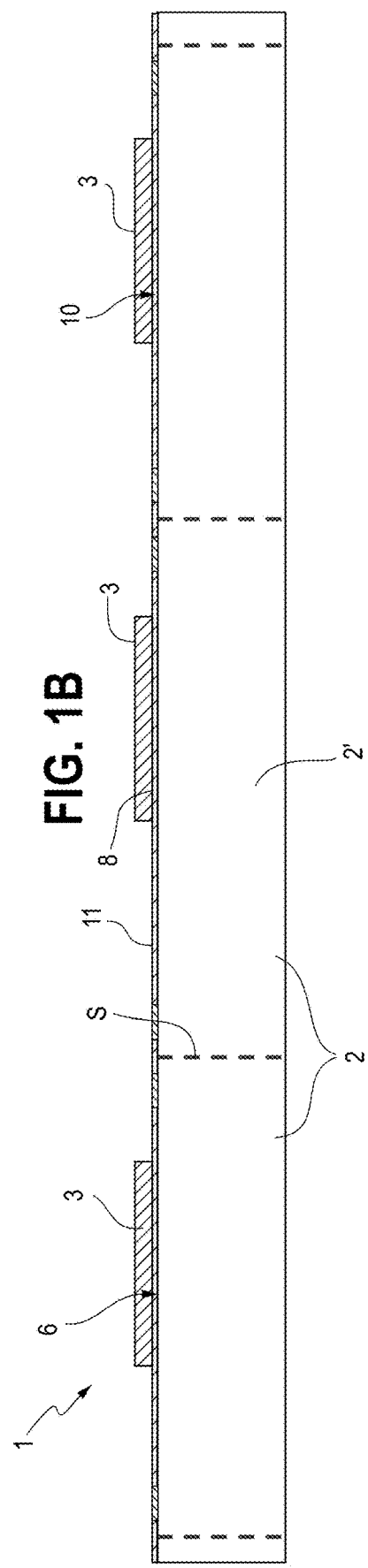

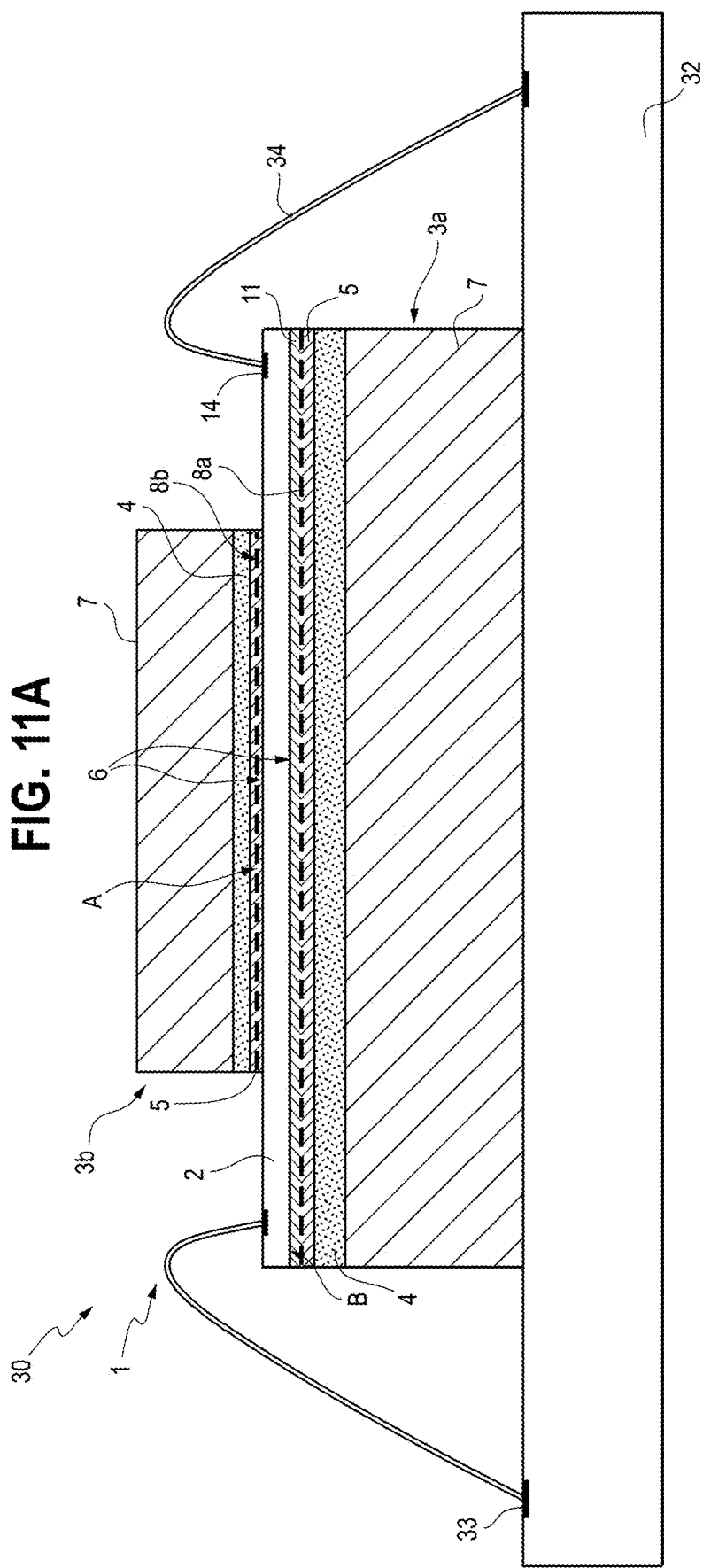

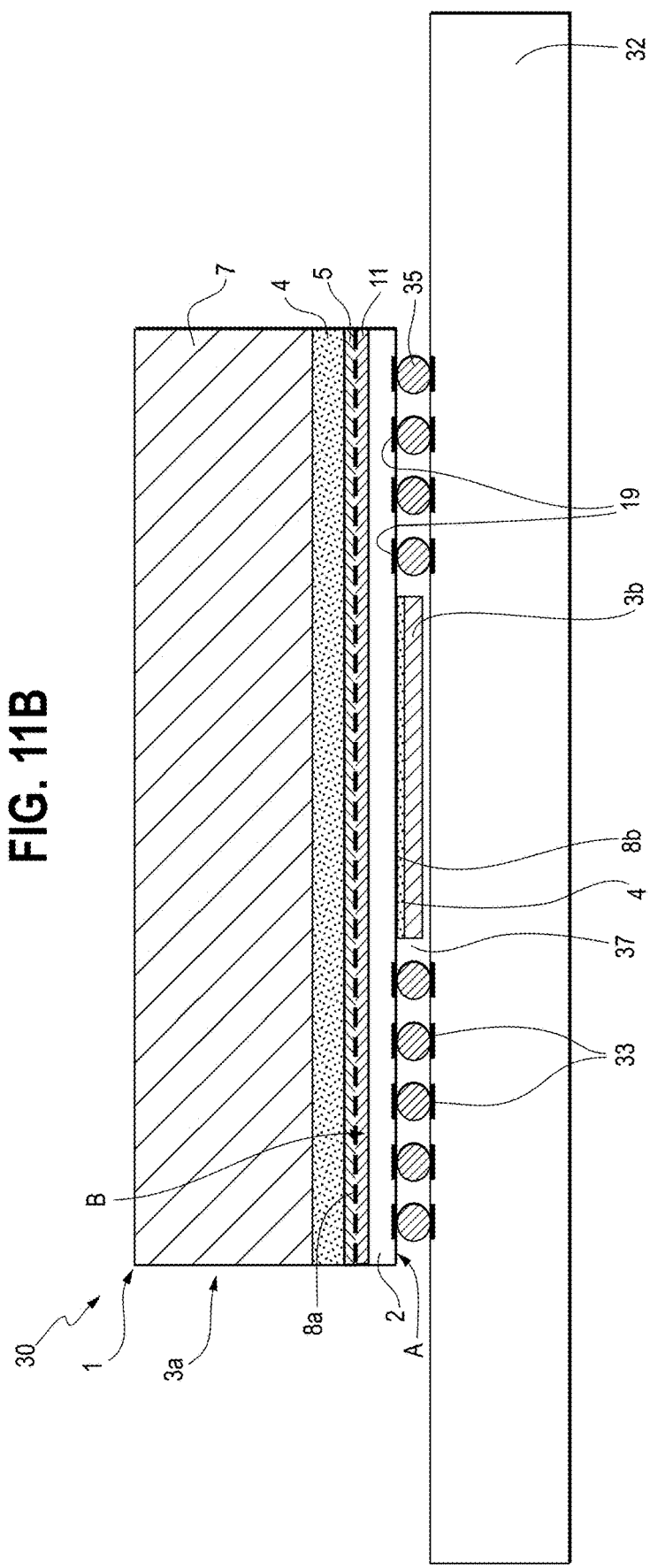

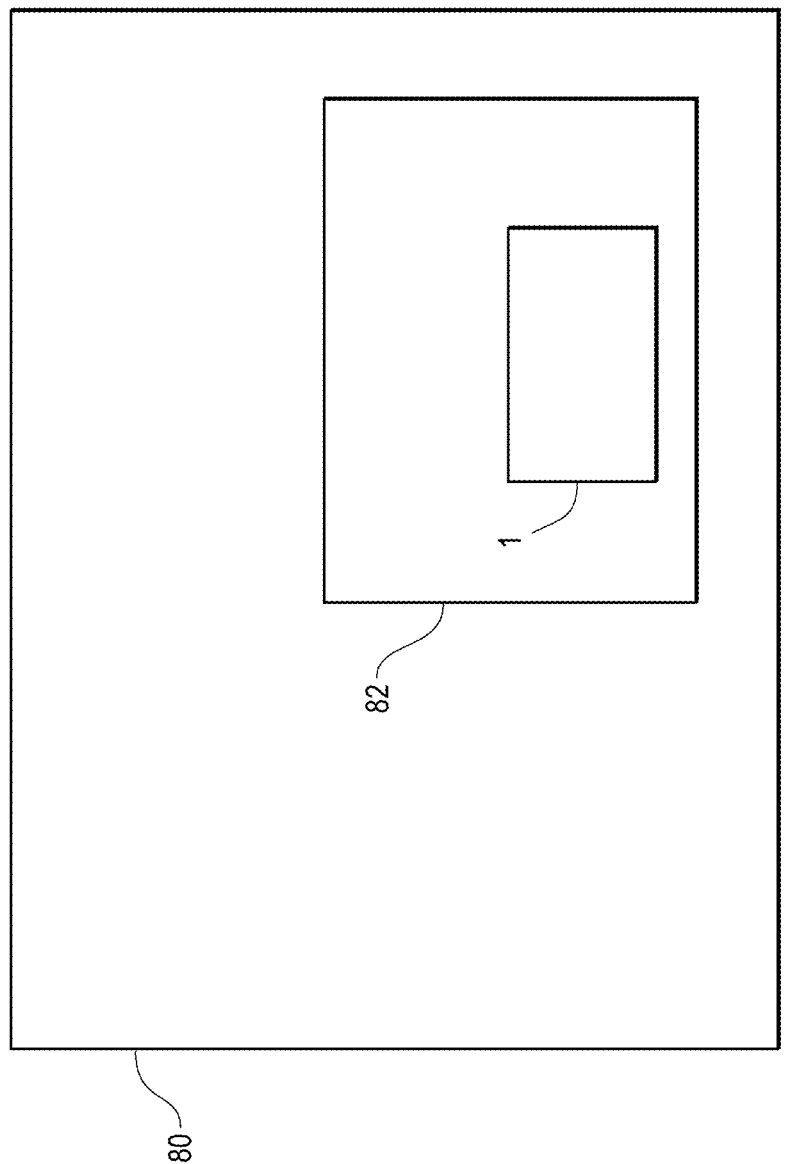

BONDED STRUCTURE INCLUDING AN OBSTRUCTIVE ELEMENT DIRECTLY BONDED TO A SEMICONDUCTOR ELEMENT WITHOUT AN ADHESIVE

CROSS-REFERENCE TO RELATED APPLICATIONS

This application is a continuation of U.S. patent application Ser. No. 16/844,932, filed Apr. 9, 2020, issued as U.S. Pat. No. 11,610,846 which claims priority to U.S. Provisional Patent Application No. 62/833,491, filed Apr. 12, 2019, and claims priority to U.S. Provisional Patent Application No. 62/953,058, filed Dec. 23, 2019, the contents of each of which are hereby incorporated by reference herein in their entirety and for all purposes.

BACKGROUND

Field of the Invention

The field relates to protective or obstructive elements for bonded structures and, in particular, to protective elements that include an obstructive material.

Description of the Related Art

Semiconductor chips (e.g., integrated device dies) may include active circuitry containing security-sensitive components which contain valuable and/or proprietary information, structures or devices. For example, such security-sensitive components may include an entity's intellectual property, software or hardware security (e.g., encryption) features, privacy data, or any other components or data that the entity may wish to remain secure and hidden from third parties. For example, third party bad actors may utilize various techniques to attempt to access security-sensitive components for economic and/or geopolitical advantage. Accordingly, there remains a continuing need for improving the security of semiconductor chips from being accessed by third parties.

BRIEF DESCRIPTION OF THE DRAWINGS

FIG. 1A is a schematic side sectional view of a protective element, according to one embodiment.

FIG. 1B is a schematic side sectional view of a bonded structure that includes a plurality of protective elements directly bonded to a semiconductor element.

FIG. 11A illustrates an integrated device package in which protective elements are provided on opposing sides of a semiconductor element, according to one embodiment.

FIG. 11B illustrates an integrated device package in which protective elements are provided on opposing sides of a semiconductor element, according to another embodiment.

FIG. 12 is a schematic diagram of an electronic system incorporating one or more bonded structures, according to various embodiments.

DETAILED DESCRIPTION

Figure 2:
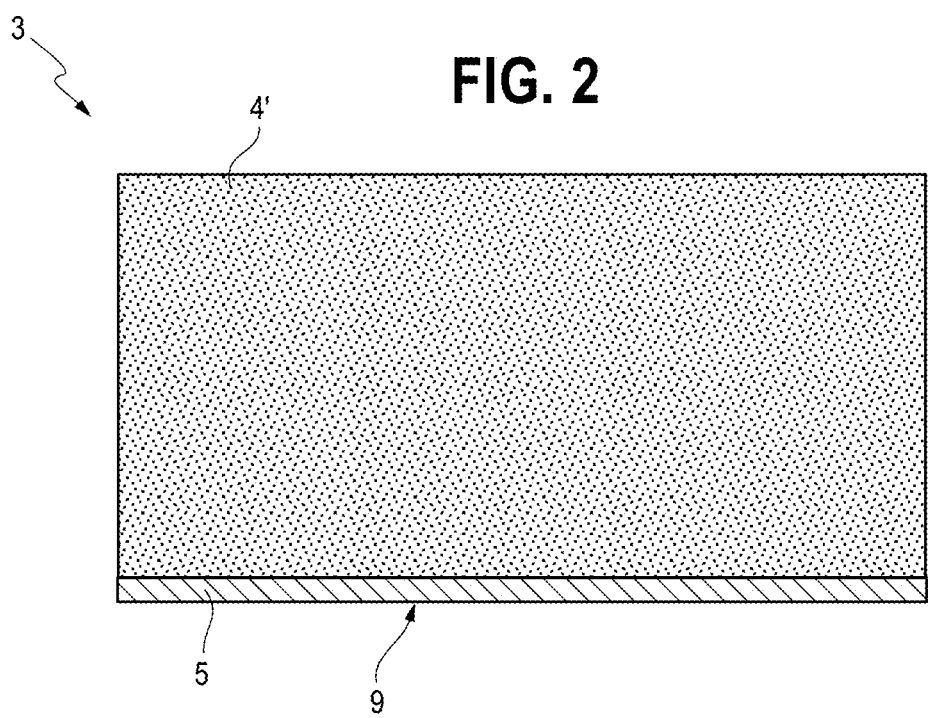
FIG. 2 is a schematic side sectional view of a protective element comprising an obstructive material, according to another embodiment.

As explained herein, third parties (such as third party bad actors) may attempt to access security-sensitive components on elements such as integrated device dies. In some elements, the security-sensitive components may be protected by a combination of netlist and non-volatile memory (NVM) data. However, third parties may attempt to hack the security-sensitive components by a combination of destructive and non-destructive techniques, e.g., probing and/or delayering the element to expose or otherwise gain access to the security-sensitive components. In some cases, the third party may attempt to hack the security-sensitive components by pulsing electromagnetic (EM) waves onto active circuitry of the element, using fault injection techniques, employing near infrared (NIR) triggering or focused ion beam (FIB) modification of circuits, chemical etching techniques, and other physical, chemical, and/or electromagnetic hacking tools and even reverse engineering. These techniques can be used to physically access sensitive circuits of microdevices such as integrated circuits to directly read encrypted information, to trigger circuits externally to release information otherwise encrypted, to understand manufacturing processes, or even to extract enough information to be able to eventually replicate sensitive designs. For example, in some cases hackers may attempt to access the encryption key, which can be stored in the circuit design, in memory, or in a combination of both. Techniques can also be used to indirectly read sensitive information by analyzing the resultant output based upon fault injection inputs, and through recursive analysis determine the encryption key or data contents. It is challenging to structurally protect the security-sensitive components on elements.

Accordingly, it is important to provide improved security for elements (such as semiconductor integrated device dies) that include security-sensitive components.

One way to physically protect chips from such unauthorized access is to provide materials that are difficult to remove or penetrate by grinding, polishing, chemical etching or by any other technique. However, some such materials (e.g., abrasive materials) may have a process temperature that is too high to apply to fabricated semiconductor devices, which have strict thermal budgets after devices are fabricated. The processing of some materials can also be chemically incompatible with typical semiconductor processing foundries. The obstructive materials may not be typically used or found in standard semiconductor processing foundries, and/or the obstructive materials may utilize non-standard processing.

Various embodiments disclosed herein can utilize a chip or chiplet having a protective element 3 (also referred to herein as an obstructive element) including, for example, a security or obstructive material 4 that protects a sensitive circuit region 6 (also referred to herein as sensitive circuitry) to which it is bonded. In some embodiments, the obstructive material 4 can include a physically destructive material (e.g., an abrasive and/or hard material) configured to physically damage or destroy tooling that attempts to access sensitive circuitry 6, to physically damage or destroy the sensitive circuitry 6 itself, or otherwise prevent physical or mechanical access to the sensitive circuitry 6. In some embodiments, the obstructive material 4 can additionally or alternatively comprise a light-blocking material configured to block incident electromagnetic radiation (e.g., infrared radiation, such as near infrared light) from accessing the sensitive circuitry 6. In some embodiments, the obstructive material 4 can comprise a light-blocking material that is also a destructive material, such that the obstructive material 4 can prevent physical and electromagnetic access to the sensitive circuitry 6. In some embodiments, the obstructive material 4 can comprise a light-blocking material that is not also a destructive material. In other embodiments, the obstructive material 4 can comprise a destructive material that is not also a light-blocking material. In some embodiments, the obstructive material 4 can comprise a light-scattering, light diffusing or light filtering material.

In embodiments that utilize a destructive material for the obstructive material 4, the obstructive material 4 (which can comprise, e.g., a diamond based material like synthetic diamond, diamond-like carbon or industrial diamond, tungsten, a synthetic fiber, carbides (e.g., silicon carbide, tungsten carbide, boron carbide), borides (e.g., tungsten boride, rhenium boride, aluminum magnesium boride, etc.), boron nitride, carbon nitride, sapphire, and some types of ceramics or other suitably destructive material or combination of materials) can be provided adjacent to a bond interface 8. In some embodiments, particles of these destructive materials may be dispensed into a mixture to form the obstructive material 4. In various embodiments, the obstructive material 4 can be unpatterned and/or a blanket material layer, as opposed to a patterned layer. For example, the obstructive layer 4 can comprise a blanket layer over the entire protective element 3, or a blanket layer over the sensitive region 6 of the circuitry to be protected. A bonding layer 5 (e.g., a semiconductor material or inorganic dielectric) can be provided over the blanket layer of obstructive material 4. As explained herein, the obstructive material 4 can be directly bonded without an adhesive to a semiconductor element 2 to form a bonded structure 1 in various arrangements. As explained herein, the semiconductor element 2 can comprise any suitable type of semiconductor element, such as an integrated device die, an interposer, a semiconductor wafer, a reconstituted wafer, etc. The chosen obstructive material 4 may have a high shear modulus, a high bulk modulus and may not exhibit plastic deformation. For example, materials with a hardness of greater than 80 GPa (for example, as measured on the Vickers scale) can be used for the destructive material 4. In various embodiments, the destructive material can have a hardness of at least 12 GPa, at least 13 GPa, at least 15 GPa, at least 20 GPa, at least 30 GPa, or at least 50 GPa, as measured on the Vickers scale. For example, the destructive material can have a hardness in a range of 12.5 GPa to 150 GPa, in a range of 13 GPa to 150 GPa, in a range of 15 GPa to 150 GPa, in a range of 20 GPa to 150 GPa, in a range of 40 GPa to 150 GPa, or in a range of 80 GPa to 150 GPa as measured on the Vickers scale. In another example, the abrasive or destructive material may have a hardness higher than typical materials used in semiconductor chip. For example, the hardness of the destructive material may be higher than that of Si, SiO, SiN, SiON, SiCN, etc. The obstructive material 4 may comprise one or more materials or layers deposited over one another in some embodiments. Moreover, the obstructive material 4 may comprise one continuous, non-continuous or patterned layer, or the obstructive material 4 may comprise several such continuous, non-continuous or patterned layers. In some embodiments, there may not be any circuitry or wiring within the obstructive material 4. In other embodiments, the obstructive material 4 may include electrical circuitry embedded in the material 4, or conductive vias partially or fully penetrating the obstructive material 4.

The obstructive or protective element 3 (e.g., a chip or chiplet) can be directly bonded (e.g., using dielectric-to-dielectric bonding techniques, such as the ZiBond® techniques used by Xperi Corporation of San Jose, California) to at least sensitive areas 6 (for example, areas that include security-sensitive components) of an element 2 (such as a semiconductor chip) that can benefit from high security protection from third party tampering. For example, the dielectric-to-dielectric bonds may be formed without an adhesive using the direct bonding techniques disclosed at least in U.S. Pat. Nos. 9,391,143 and 10,434,749, the entire contents of each of which are incorporated by reference herein in their entirety and for all purposes. After the protective element 3 is direct bonded or hybrid bonded to the element 2 (e.g., a semiconductor chip or integrated device die), the one or more layers of the obstructive material 4 (which may comprise a destructive or abrasive material, or a light-blocking material or light scattering, light filtering material, or light diffusing material, etc.) may be positioned proximate the bond interface 8, for example, as close as possible to the bond interface 8. In one embodiment, the obstructive material 4 may be positioned less than 50 microns from the bond interface 8, less than 25 microns from the bond interface, or less than 10 microns from the bond interface 8, for example less than 5 microns from the bond interface 8. In various embodiments, the obstructive material 4 may be positioned in a range of about 1 micron to about 10 microns, or in a range of about 1 micron to about 5 microns, from the bond interface 8. In other embodiments, two or more obstructive or protective element 3 are directly bonded to the element 2.

In various embodiments, the direct bonds can be formed without an intervening adhesive. For example, the protective element 3 and the semiconductor element 2 can each have a bonding layer (such as bonding layer 5) with associated dielectric bonding surfaces. The respective dielectric bonding surfaces 9, 10 of the protective element 3 and the semiconductor element 2 can be polished to a high degree of smoothness. The bonding surfaces 9, 10 can be cleaned and exposed to a plasma and/or suitable chemistries (e.g., etchants) to activate the surfaces 9, 10. In some embodiments, the surfaces 9, 10 can be terminated with a species after activation or during activation (e.g., during the plasma and/or chemical processes). In various embodiments, the terminating species can comprise nitrogen. Further, in some embodiments, the bonding surfaces 9, 10 can be exposed to fluorine. For example, there may be one or multiple fluorine peaks near layer and/or bonding interface 8. Thus, in the directly bonded structures disclosed herein, the bonding interface 8 between two dielectric materials can comprise a very smooth interface with higher nitrogen content and/or fluorine peaks at the bonding interface 8.

In various embodiments, direct bonding of separately fabricated protective elements 3 facilitates using separate processing that cannot be directly applied to a fabricated integrated circuit or otherwise sensitive microelectronic element, due to thermal budget, chemical compatibility constraints, or other technical reasons. For example, the obstructive materials 4 can be formed on a separate protective element 3 at a higher temperature than the direct bonding temperatures. The direct bonding process itself consumes relatively little thermal budget, including both room temperature initial covalent bonding between dielectric bonding layers, and possible annealing to strengthen the bonds and/or facilitate metal bonding in a hybrid bonding process.

If a third party attempts to remove the destructive material (e.g., an abrasive and/or hard material), the removal tools can be damaged (by abrasive obstructive materials) and/or the underlying active circuitry may be damaged by the removal attempt. The obstructive material 4 can thus be "destructive" to either the removal tools or the protected circuit. Either result can introduce significant resistance to or entirely prevent reverse engineering, hacking, inspection, or other breach of the secured area, circuitry or devices.

In some embodiments, the obstructive material 4 can comprise an abrasive and/or destructive layer on a chiplet. Additionally or alternatively, the chiplet itself may comprise an abrasive and/or destructive material, and/or a hard material. Multiple abrasive and/or destructive materials may be combined in multiple layers or patterns within a layer to enhance the destructive effect. As explained above, the destructive material (e.g., abrasive and/or hard material) may be very close to the bond interface 8. For example, the destructive material may be positioned within 5 microns from the bond interface 8. The third party may attempt to etch or grind away the protective chiplet. If the destructive material is very close to the bond interface 8 between the protective element 3 (chiplet) and the semiconductor element 2, the method to remove or grind away the chiplet becomes significantly difficult.

In various embodiments, as explained above, the obstructive material 4 can alternatively or additionally comprise a light-blocking material configured to block light or electromagnetic waves. For example, the obstructive material 4 can be selected to block light at wavelengths in a range of 700 nm to 1 mm, in a range of 750 nm to 2500 nm, or in a range of 800 nm to 2500 nm. The obstructive material 4 can alternatively or additionally be selected or shaped to scatter, filter or diffuse incident light. The obstructive material 4 can alternatively or additionally be electrically conductive, and may effectively act as electromagnetic shield. In various embodiments, the obstructive material 4 can be selected to block near infrared (NIR) and focused ion beam (FIB) fault intrusion attempts. In another embodiment, the obstructive material 4 may comprise or may be deposited with one or more layers of optical or infrared filters. The thin film optical filters may act to filter out or modify the optical or IR light irradiated through them in either direction, e.g., light incident upon the circuit to trigger a response or the light emitted from the circuit to detect a response to a hacking technique.

In some embodiments, a portion of the security structure or circuit may be shared between the protective element 3 (e.g., the chiplet with the abrasive and/or destructive material) and the element 2 to be protected (e.g., the integrated device die with secure active areas 6). For example, a hybrid bonding technique can be used to provide conductor-to-conductor direct bonds along a bond interface 8 that includes covalently direct bonded dielectric-to-dielectric surfaces 9, 10. In various embodiments, the conductor-to-conductor (e.g., contact pad to contact pad) direct bonds and the dielectric-to-dielectric bonds can be formed using the direct bonding techniques disclosed at least in U.S. Pat. Nos. 9,716,033 and 9,852,988, the entire contents of each of which are incorporated by reference herein in their entirety and for all purposes.

For example, dielectric bonding surfaces 9, 10 can be prepared and directly bonded to one another without an intervening adhesive. Conductive contact pads 14 (which may be surrounded by nonconductive dielectric field regions of the bonding layer 5) may also directly bond to one another without an intervening adhesive. For example, in some embodiments, the respective contact pads 14 can be flush with the surface of the dielectric surfaces 9, 10 or recessed below the dielectric field regions, for example, recessed in a range of 1 nm to 20 nm, or in a range of 4 nm to 10 nm. The bonding surfaces 9, 10 of the dielectric field regions (e.g., bonding layer 5) can be directly bonded to one another without an adhesive at room temperature in some embodiments and, subsequently, the bonded structure 1 can be annealed. Upon annealing, the contact pads 14 can expand and contact one another to form a metal-to-metal direct bond.

In various embodiments, the processes disclosed herein can utilize wafer-to-wafer (W2W) bonding process for three-dimensional (3D) integration applications. In some embodiments, protective materials can be printed over security-sensitive components or regions 6.

FIG. 1A is a schematic side sectional view of a protective element 3, according to one embodiment. In FIG. 1A, the protective element 3 includes a semiconductor (e.g., silicon) base or substrate 7 (also referred to herein as a carrier). In other embodiments, the substrate 7 for the security chiplet need not be semiconductor, as it serves primarily as a carrier for an obstructive material 4 and bonding layer 5, as explained below, and can instead be other materials, such as glass or quartz. However, semiconductor substrates are provided in formats convenient for processing and handling with existing equipment and also with sufficient flatness and smoothness to simplify subsequent polishing of the bonding layer 5.

As shown, a security or obstructive material 4 can be provided over an exterior surface of the carrier or substrate 7. As explained herein, the obstructive material 4 can function to obstruct physical access to a protected circuit or sensitive circuit region 6, and can thus be considered an "obstructive material." As explained above, the obstructive material 4 can comprise an abrasive and/or destructive material (e.g., a material having a high mechanical hardness compared to the materials commonly used in semiconductor fabrication, such as silicon, silicon oxide, silicon nitride, aluminum and copper). The obstructive material 4 may be difficult to remove via standard techniques, for example, grinding, polishing, wet or dry etching, etc., when compared to the standard materials used in semiconductor fabrication. In various embodiments, the obstructive material 4 can additionally or alternatively be selected so as to block impinging electromagnetic radiation. The obstructive material 4 can comprise, for example, ceramic materials, composite materials, diamond, a combination of diamond and tungsten, or any other suitable type of obstructive material that can prevent external access to active circuitry on the semiconductor element 2 to which the protective element 3 is to be bonded. In various embodiments, the obstructive material 4 can comprise a material for which selective etchants may be unavailable to remove the obstructive material 4 without removing inorganic dielectrics common to semiconductor fabrication.

The obstructive material 4 can be fabricated and assembled onto the carrier or substrate 7 in a first facility at one or more first processing temperatures. For example, the obstructive material 4 may be deposited onto the carrier or substrate 7 at temperature(s) of at least 400° C., or at least 800° C., for example, in a range of 400° C. to 1000° C. or higher. Such high processing temperatures may not be suitable in foundries that are used to manufacture the semiconductor element 2, e.g., a wafer or an integrated device die (which after fabrication should not be exposed to temperatures of greater than 300° C., or greater than 400° C. for prolonged periods of time), because such high temperatures may damage the active circuitry 6 and other components of the semiconductor element 2. In some cases the materials employed for obstruction layers may be incompatible with semiconductor fabrication facilities due to concerns with contamination. Although only one layer of obstructive material 4 is shown in FIG. 1, two or more layers of the same or different obstructive materials as described above may be deposited. In some embodiments, an obstruction function may be performed by one layer of materials, while in some other embodiments, several layers of different materials (or of the same material) may serve to obstruct third party access to the sensitive circuitry 6. For example, several layers of materials having certain properties (e.g., refractive index) and thickness may be provided to introduce optical filtering, scattering or blocking functionality. In one embodiment, one or more such layers of obstructive materials 4 may be deposited on top of another one or more layers of destructive materials. In another embodiment, one or more such layers of obstructive materials 4 may be separated by one or more layers of standard semiconductor materials, for example, silicon, silicon oxide, silicon nitride, etc.

A bonding layer 5 can be provided on the obstructive material 4. In another embodiment, one or more buffer layers (not shown in FIG. 1A) may be deposited on the obstructive material 4, before depositing the bonding layer 5. One or more buffer layers may be used due to process limitations (e.g., low adhesion between bonding layer 5 and obstructive material 4), in which it may be challenging to directly deposit the bonding layer 5 on the obstructive material 4. The bonding layer 5 can include any suitable type of nonconductive or dielectric material, particularly inorganic dielectrics compatible with integrated circuit fabrication, such as silicon oxide, silicon nitride, etc. In some embodiments, a bonding layer 11 can also be provided on the semiconductor element 2. The bonding layer 5 (e.g., silicon oxide) can be thin such that the layer 5 does not adequately protect or shield the secure circuitry 6 from third party access. As shown in FIG. 1B, the protective element 3 can be directly bonded to the semiconductor element 2 without an adhesive. As explained herein, the respective bonding layers 5, 11 can be prepared for bonding. For example, the bonding layers 5, 11 can have bonding surfaces 9, 10 that are planarized to a high degree of surface smoothness and exposed to a terminating treatment (e.g., a nitrogen termination treatment). The bonding layers 5, 11 of the protective element 3 and the semiconductor element 2 can be brought into contact with one another at room temperature, and without application of an adhesive or voltage. The bonding layers 5, 11 can form a strong covalent bond along a bond interface 8. The strong covalent bonds may be sufficient for handling and even for post-bonding processing, such as grinding, polishing or otherwise thinning substrates, singulation, etc., but a post-bonding anneal can increase the strength of the bonds even further. In another embodiment, the bonding layer 11 can be directly bonded to the obstructive material 4, and the bonding layer 5 on the protective element 3 may not be provided.

As shown in FIG. 1B, a plurality of semiconductor elements 2 in some embodiments can be provided in wafer form as a wafer 2', and a plurality of singulated protective elements 3 can be directly bonded to the wafer 2' in a die-to-wafer (D2 W) process. The wafer 2' can be singulated along saw streets S to form a plurality of bonded structures 1, each of which includes one or more protective elements 3 directly bonded to a singulated semiconductor element 2. In the illustrated embodiment, the protective elements 3 can be provided over sensitive areas of the semiconductor elements 2 so as to protect security-sensitive components 6 from external access. In some embodiments, the protective elements 3 can be provided over only a portion of the active surface of the semiconductor element 2. In other embodiments, the protective element 3 can be provided over an entirety of the semiconductor element 2. The protective element 3 and/or obstructive layer 4 can comprise a continuous or discontinuous pattern, such as a screen, grid, array of discrete obstructive features, etc. Beneficially, in the embodiment of FIGS. 1A and 1B, if a third party were to attempt to physically access the sensitive area(s) 6 of active circuitry, the obstructive material 4 would destroy or damage the tools used to remove the protective element 3. Alternatively, or additionally, attempts the remove the protective element 3 would destroy the underlying sensitive circuitry 6. Alternatively, or additionally, attempts to access the secure data, for example, via NIR triggering, may be prohibited due to the presence of protective element 3.

FIG. 2 illustrates another example of a protective element 3 comprising an obstructive material 4'. Unless otherwise noted, the components of FIG. 2 may be the same as or generally similar to like components of FIGS. 1A-1B. Unlike the embodiment of FIGS. 1A-1B, the protective element 3 of FIG. 2 may not include a carrier (e.g., a silicon substrate 7 or base shown in FIG. 1A). Rather, the protective element 3 may comprise a bulk material or block of obstructive material to define an obstructive chiplet 4' (e.g., an abrasive material, light-blocking material, etc.). The bonding layer 5 can be provided over the hard or obstructive chiplet 4' of FIG. 2. Similar to the arrangement of FIG. 1B, the bonding layer 5 of the obstructive chiplet 4' can be prepared for direct bonding, and the bonding layer 5 can be directly bonded to a semiconductor element 2 without an adhesive. In the arrangement of FIG. 2, the use of a larger bulk obstructive material may be more difficult to remove and/or more likely to cause destruction of the underlying sensitive circuitry 6 upon physical access attempts by a third party.

Figure 3:
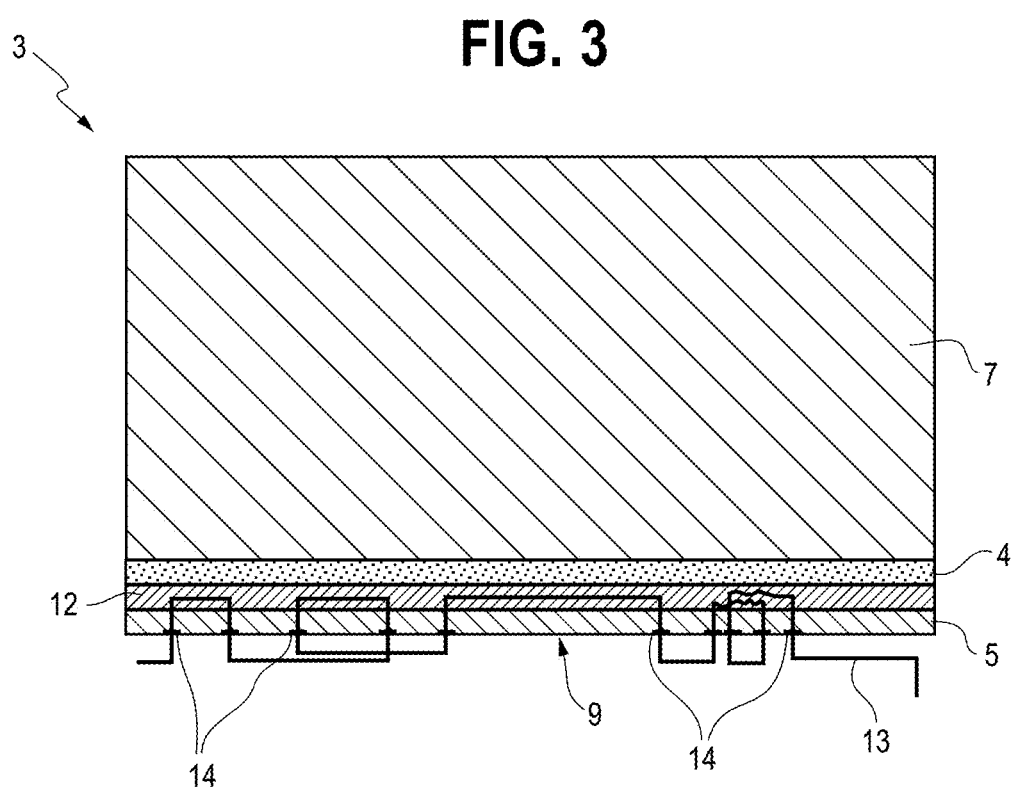
FIG. 3 is a schematic side sectional view of a protective element including routing circuitry and contact pads configured to be directly bonded to a semiconductor element.

FIG. 3 illustrates another embodiment of a protective element 3 comprising an obstructive material 4. Unless otherwise noted, the components of FIG. 3 may be the same as or generally similar to like components of FIGS. 1A-1B. For example, as with FIGS. 1A-1B, the protective element 3 can include a carrier (such as a silicon base or substrate 7), an obstructive material 4 on the carrier or substrate 7, and a bonding layer 5 configured to directly bond to a semiconductor element 2 (such as an integrated device die, wafer, etc.) without an adhesive. Similar to the arrangement of FIG. 1B, the bonding layer 5 can be prepared for direct bonding, and the bonding layer 5 can be directly bonded to a semiconductor element 2 without an adhesive to form a covalent, dielectric-to-dielectric direct bond. Unlike the embodiment of FIGS. 1A-1B, however, in FIG. 3, a nonconductive routing layer 12 can be provided over the obstructive material 4 between the obstructive material 4 and the bonding layer 5. As shown, conductive routing circuitry 13 can extend through the bonding layer 5 and along the nonconductive routing layer 12. The conductive routing circuitry 13 disposed in the protective element 3 can be configured to directly bond to corresponding circuitry in the semiconductor element 2 (see FIG. 1B). For example, wiring routing circuitry 13 and contact pads 14 can be fabricated over the obstructive material 4 and or within the non-conductive layer 12 in forming the protective element 3, using back end metallization techniques common in semiconductor fabrication, and terminating with a polished bonding layer 5 (e.g., silicon oxide, silicon nitride, silicon oxynitride, silicon carbonitride, which may be fluorinated and include nitrogen terminations) with exposed contact pads 14, which may be recessed prior to bonding. The contact pads 14 of the protective element 3 connected to the routing circuitry 13 can be directly bonded and electrically connected to corresponding contact pads (not shown) on the semiconductor element 2. The direct bonding of the contact pads 14 on the protective element 3 to corresponding contact pads (not shown) of the semiconductor element 2 can be accomplished using hybrid dielectric-to-dielectric and conductor-to-conductor bonding processes, such as Direct Bond Interconnect, or DBI® processes, developed by Xperi Corporation of San Jose, California, described herein. In FIG. 3, the routing circuitry 13 is schematically illustrated as extending outside (e.g., below) the bonding surface 9, but it should be appreciated that the portion of the routing circuitry 13 shown below the bonding surface 9 would instead extend through the corresponding bonding surface 10 of the semiconductor element 2. Thus, the routing circuitry 13 can extend across the bond interface 8 in various embodiments. The routing circuitry 13 may be one daisy chain distributed between the protective element 3 and the semiconductor element 4, or it may include several such independent daisy chains. In some embodiments, the routing circuitry 13 may only include a passive daisy chain, while in some other embodiments, one or more intact daisy chains may enable one or more functions within the semiconductor element 2.

Providing a portion of the circuitry 13 on the protective element 3 can beneficially improve the security of the bonded structure 1. For example, if the semiconductor element 2 were attacked by a material removal process, a portion of the circuitry 13 on the semiconductor element 2 would be damaged, breaking the circuit with the other portion of circuitry 13 on the protective element 3. In one embodiment, the routing circuitry 13 shared between the protective element 3 and the protected circuitry 6 and crossing the bonding interface 8 may be part of the protected circuitry's power mesh. Delayering to remove the protective element 3 may thus interrupt the power supply to the protected circuit 6 and prevent operation by fault injection to bypass security measures.

Figure 4:
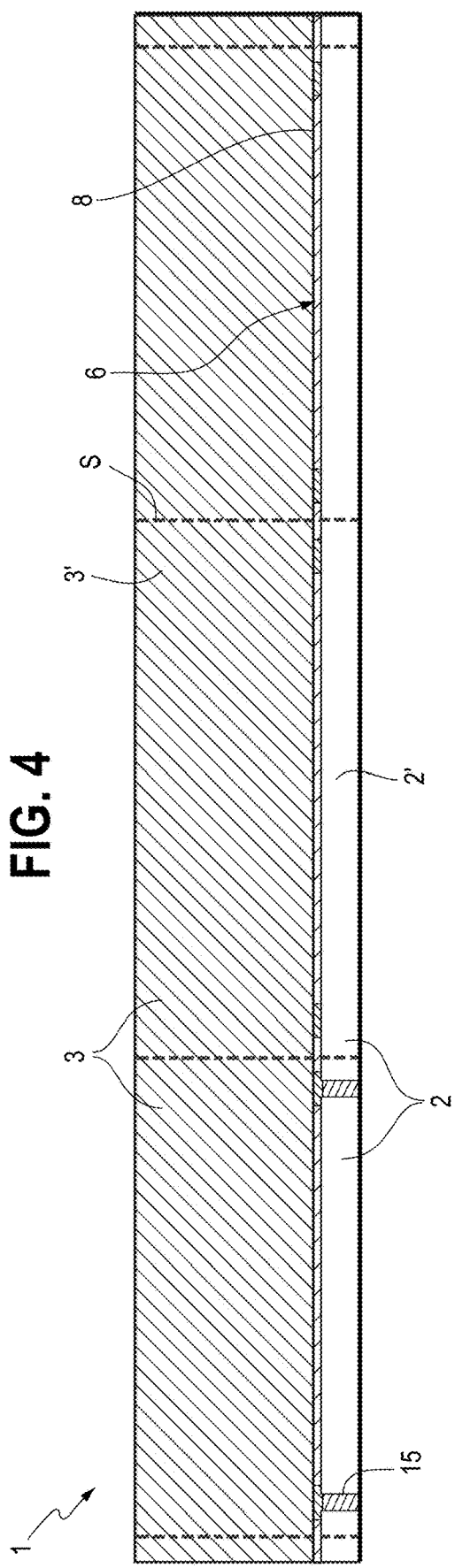
FIG. 4 is a schematic side sectional view showing protective elements and semiconductor elements in wafer form, according to various embodiments.

Turning to FIG. 4, a wafer-to-wafer (W2 W) approach is illustrated. In FIG. 4, both the protective element 3 and the semiconductor element 2 can be fabricated in wafer form. The protective element 3 can include the obstructive material 4 shown in FIG. 1A, but which is not illustrated in FIG. 4 due to the relative sizing of the elements 3, 2 shown. A first wafer 3' that includes regions that define the protective elements 3 and a second wafer 2' that includes regions that define the semiconductor elements 2 can be directly bonded to one another without an adhesive along a direct bonding interface 8. The bonded wafers can be singulated along saw streets S to form a plurality of bonded structures 1. For example, the bonded wafers 2', 3' can be singulated using special saws, laser singulation, chemical etching, plasma etching, scored-and-fractured (e.g., scribe and break), phantom scribed, or a combination thereof. The semiconductor elements 2 can include sensitive circuit regions 6 and any other suitable wiring, such as conductive vias 15. In one embodiment, an outer portion of wafer 3' may be etched away after wafer-to-wafer (W2 W) bonding, such that the protective element 3 is protecting only a portion of the semiconductor element 2.

Figure 5:
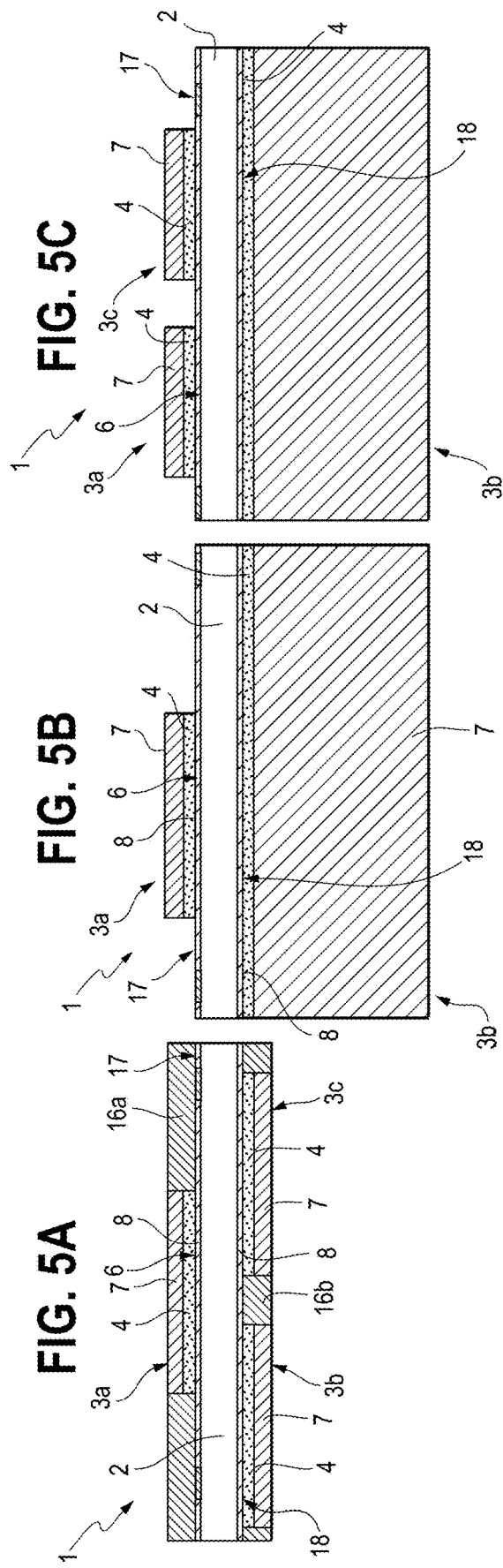
FIG. 5A is a schematic side sectional view of a bonded structure having a plurality of protective elements directly bonded to opposing sides of a semiconductor element.
FIG. 5B is a schematic side sectional view of a bonded structure with protective elements directly bonded to opposing sides of a semiconductor element, according to another embodiment.
FIG. 5C is a schematic side sectional view of a bonded structure with protective elements directly bonded to opposing sides of a semiconductor element, according to another embodiment.

FIGS. 5A-5C illustrate additional embodiments of bonded structures 1 in which protective element(s) 3 are directly bonded to opposing sides 17, 18 of a semiconductor element 2. This could enabled by W2 W (and etching non-required portion of 3') or D2 W (die to wafer) direct bonding. Unless otherwise noted, reference numerals in FIGS. 5A-5C refer to components that may be generally similar to or the same as like-numbered components of FIGS. 1A-4. As shown in FIGS. 5A-5B, the protective elements 3 can protect both a top side 17 and a bottom side 18 of the semiconductor element 2 to obviate external attacks against both sides 17, 18 of the semiconductor element 2. In FIG. 5A, for example, a plurality of singulated protective elements 3b, 3c can be directly bonded to the bottom side 18 of the semiconductor element 2. A singulated protective element 3a can also be directly bonded to the top side 17 of the semiconductor element 2. A molding compound or other filler material can also be provided over the top and bottom sides 17, 18 of the semiconductor element 2, and alongside surfaces of the protective elements 3a-3c. For example, as shown in FIG. 5A, a first molding compound 16a can be provided over the top side 17 of the semiconductor element 2 and alongside surfaces of the protective element 3a. A second molding compound 16b can be provided over the bottom side 18 of the semiconductor element 2 and alongside surfaces of the protective elements 3b, 3c, including at locations between the adjacent protective elements 3b, 3c. In some embodiments, portions of the molding compound(s) 16a and/or 16b can be provided over top and bottom sides of the protective elements 3a-3c. The molding compound(s) 16a and/or 16b can comprise an insulating filler material, such as an epoxy or other encapsulant In FIGS. 5B and 5C, the protective element 3b can cover and protect substantially an entirety of one side (e.g., the bottom side 18) of the semiconductor element 2. One singulated protective element 3a (FIG. 5B) or a plurality of singulated protective elements 3a, 3c (FIG. 5C) can be provided over portions of the top side 17 of the semiconductor element 2 which include sensitive area(s) 6 of active circuitry. In some embodiments, no molding compound may be provided over the semiconductor element 2 and around the protective element(s) 3. In other embodiments, as with FIG. 5A, a molding compound may be provided.

In various embodiments, the obstructive material 4 can be printed on the protective element 3, or directly over active circuitry 6 of the semiconductor element 2. For example, the obstructive material 4 can be screen printed, ink-jet printed, or otherwise deposited on the protective element 3 or the semiconductor element 2. In various embodiments, the obstructive material 4 can be printed on the protective element 3, and the protective element 3 can be directly bonded to the semiconductor element 2.

As explained herein, semiconductor devices can be exposed to a variety of external access intrusion techniques by third parties. For example, third parties can attempt fault injection through a back or bottom side 18 of a semiconductor element (e.g., an integrated device die), which is opposite a front or top side 17 of the element with active devices. Backside fault injection can flip transistors or otherwise falsely trigger operation of a device without authorization. In various embodiments, the front side 17 of the die can include bond or contact pads to connect to an external device (such as a package substrate) by, for example, wire bonding or a flip chip connection using solder balls. Third parties can attempt back side luminescence techniques to try to optically image security-sensitive components of the semiconductor element to reverse engineer the circuitry. For example, third parties can detect small infrared (IR) emissions through silicon after injecting a stimulus. After a sufficient number of attacks, the third party may be able to determine sensitive information, such as encryption keys.

Various embodiments disclosed herein can beneficially protect against such backside intrusion techniques. For example, the embodiments of FIGS. 5A-5C can prevent such backside attacks. In other examples, explained in more detail below with respect to FIGS. 6-11B, various embodiments disclosed herein can simultaneously provide a silicon-on-oxide (SOI) structure and an integrated obstructive layer that can provide backside protection. In some embodiments, a bulk silicon carrier or substrate 7 can include an obstructive layer in a handle wafer for backside protection. The front side can be additionally protected through bonded chiplets as explained above.

Figure 6:
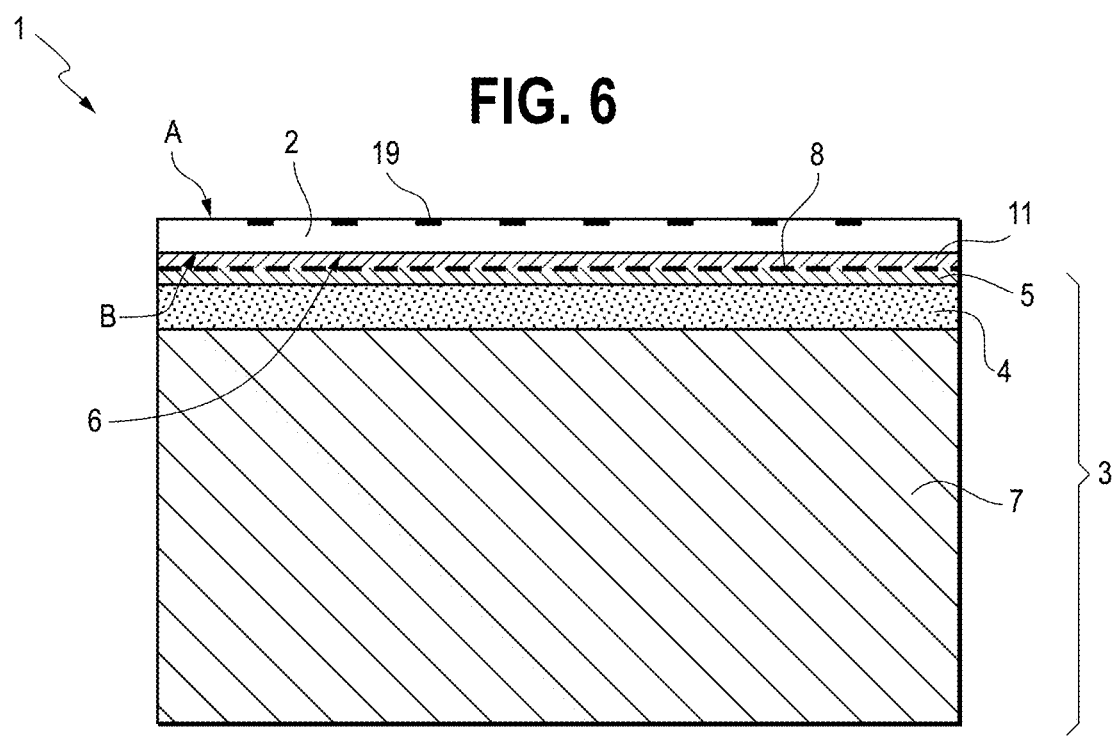
FIG. 6 is a schematic side sectional view of a bonded structure that includes a silicon-on-insulator (SOI) structure, according to another embodiment.

FIG. 6 illustrates one embodiment of a bonded structure 1 in which a semiconductor element 2 is directly bonded to a protective element 3. As explained herein, in some embodiments, the semiconductor element 2 can comprise an integrated circuit or device die having active circuitry with one or more security-sensitive area(s) 6. In the embodiment of FIG. 6, active circuitry can be disposed at or near a front side A of the semiconductor element 2 and/or at or near a back side B of the semiconductor element 2. In various embodiments, bond pads 19 may be provided on the front side A of the semiconductor element 2. The semiconductor element 2 of FIG. 6 can comprise a thinned device die. The thinning of the device die can occur before or after directly bonding the semiconductor element 2 to the protective element 3.

The semiconductor element 2 can include a first bonding layer 11, such as a dielectric material, e.g., silicon oxide. The protective element 3 can include a handle or carrier 7, an obstructive material 4 over the handle or carrier 7, and a second bonding layer 5 (e.g., silicon oxide) over the obstructive material 4. The first and second bonding layers 11, 5 can be directly bonded to one another without an adhesive to bond the semiconductor element 2 to the protective element 3. In some embodiments, as explained above, contact pads may be provided on or in the insulating bonding layers 11, 5. The contact pads may also be directly bonded to one another without an adhesive using a suitable hybrid direct bonding technique in some embodiments. As explained herein, the obstructive material 4 can comprise one or more of an abrasive material, a light blocking material, a conductive material, an insulating material, a light or electromagnetic (EM) wave scattering material, etc. The obstructive material 4 can accordingly prevent third parties from accessing the security-sensitive area(s) 6 of the semiconductor element 2. For example, in some embodiments, the obstructive material 4 can prevent the observation of light emissions from the back side B, and/or can disrupt a material removal operation from the back side B.

SOI substrates can be formed by bonding a handle wafer to an active device wafer with buried oxide (BOX) therebetween. In the case of FIG. 6, a similar process can provide the buried oxide (BOX) and the obstruction material 4 by using direct bonding of bonding layers comprises inorganic dielectrics, and particularly silicon oxide (including, for example, fluorination and/or nitrogen terminations that leave signatures at the bonding interface 8 in FIG. 6). The bonding layers 11, 5 together serve as the BOX for an SOI layer, where the BOX layer can include signature fluorine and/or nitrogen profiles from direct bonding at the interface 8 between the bonding layers 11, 5 (and within the BOX). The active device wafer can then be thinned and processed to form active devices in the semiconductor element 2 such as transistors in the thin remaining active silicon (or other semiconductor) and conventional metallization layers formed over that. Optionally, the carrier or handle wafer can also be thinned before or after singulation. In another embodiment, the thick portion of active device layer may be removed using a technique similar to a smart cut, leaving a very thin active device wafer.

Figure 7:
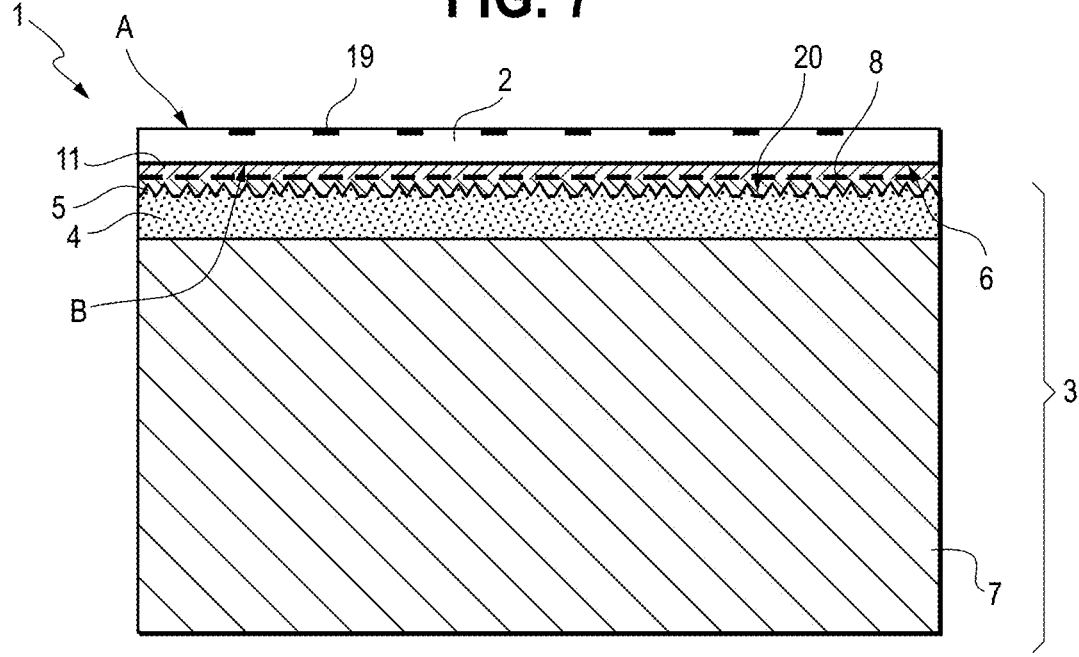
FIG. 7 is a schematic side sectional view of a bonded structure that includes an obstructive material with a roughened surface.

Turning to FIG. 7, a bonded structure 1 similar to that shown in FIG. 6 is illustrated. Unless otherwise noted, the components of FIG. 7 may be the same as or generally similar to like components of FIG. 6. In the embodiment of FIG. 7, the obstructive material 4 may be deposited on the carrier 7, for example, using chemical vapor deposition (CVD), physical vapor deposition (PVD), or any other suitable technique. The deposition may be designed so as to leave a rough upper surface 20 onto which the second bonding layer 5 is provided, which is then directly bonded to the bonding layer 11 of the semiconductor element 2, which can include an active silicon (or other semiconductor) substrate. In another embodiment, the surface of the obstructive material 4 may be roughened by any suitable technique after its deposition. As the second bonding layer 5 is deposited over this rough surface, one or more polishing techniques including chemical mechanical polishing may be used to provide a bondable surface of dielectric bonding layer 5. As explained above, the semiconductor element 2 with the active silicon can be thinned. The rough upper surface 20 of the obstructive material 4 may introduce light scattering or diffusion of any incident light going from one side to another across the rough interface. The rough upper surface 20 of the obstructive material 4 may also enhance the abrasiveness or hardness of the protective element 3 so as to further improve security of the sensitive area(s) 6 of the semiconductor element 2. The rough upper surface 20 of the obstructive material 4 may also make polishing, grinding or etching away of the obstruction material even more difficult. Further, the use of both the bonding layer 5 (e.g., silicon oxide) and the obstructive material 4 can complicate the removal process since attempts to remove the obstructive material 4 may destroy the bonding layer 5 and attempts to remove the bonding layer 5 may destroy or damage the obstructive material 4.

Figure 8:
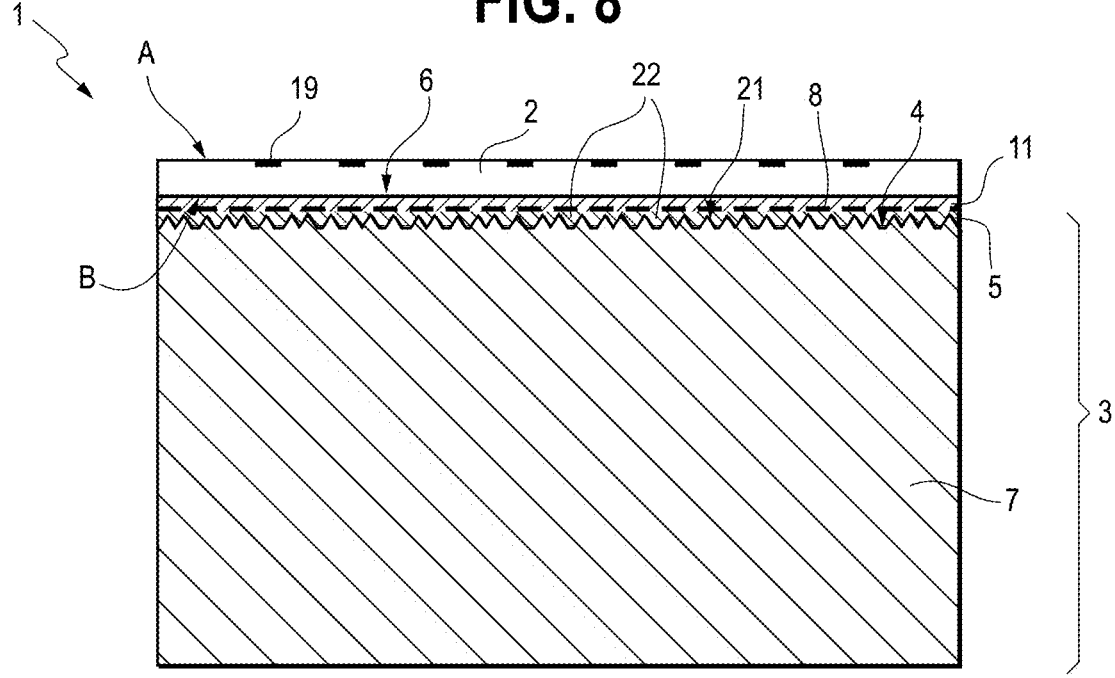
FIG. 8 is a schematic side sectional view of a bonded structure that includes an obstructive material comprising a roughened upper surface of a carrier.

FIG. 8 illustrates a bonded structure 1 similar to that shown in FIGS. 6 and 7. Unless otherwise noted, the components of FIG. 8 may be the same as or generally similar to like components of FIGS. 6-7. Unlike the embodiment of FIG. 7, the protective element 3 may comprise a bulk handle or carrier 7 and a bonding layer 5 (e.g., an oxide layer) disposed on the bulk handle or carrier 7. The upper surface of the handle or carrier 7 can comprise a roughened upper surface 21, with the second bonding layer 5 applied over the roughened upper surface 21. In FIG. 8, the obstructive material 4 can comprise the roughened upper surface 21 of the handle or carrier 7 and portions 22 of material (e.g., portions 22 of the dielectric bonding layer 5) within recesses of the roughened upper surface 21. Upon direct bonding to the semiconductor element 2, the roughened interface between the second bonding layer 5 (e.g., an oxide layer) and the roughened upper surface 21 of the bulk handle or carrier 7 may provide a light scattering, diffusion and/or lensing effect in which light incident on the semiconductor element 2 may be scattered through the backside of the protective element 3. Such optical scattering can obviate attempts to access the sensitive area(s) 6 of the semiconductor element 2 using optical or electromagnetic (EM) techniques.

Figure 9:
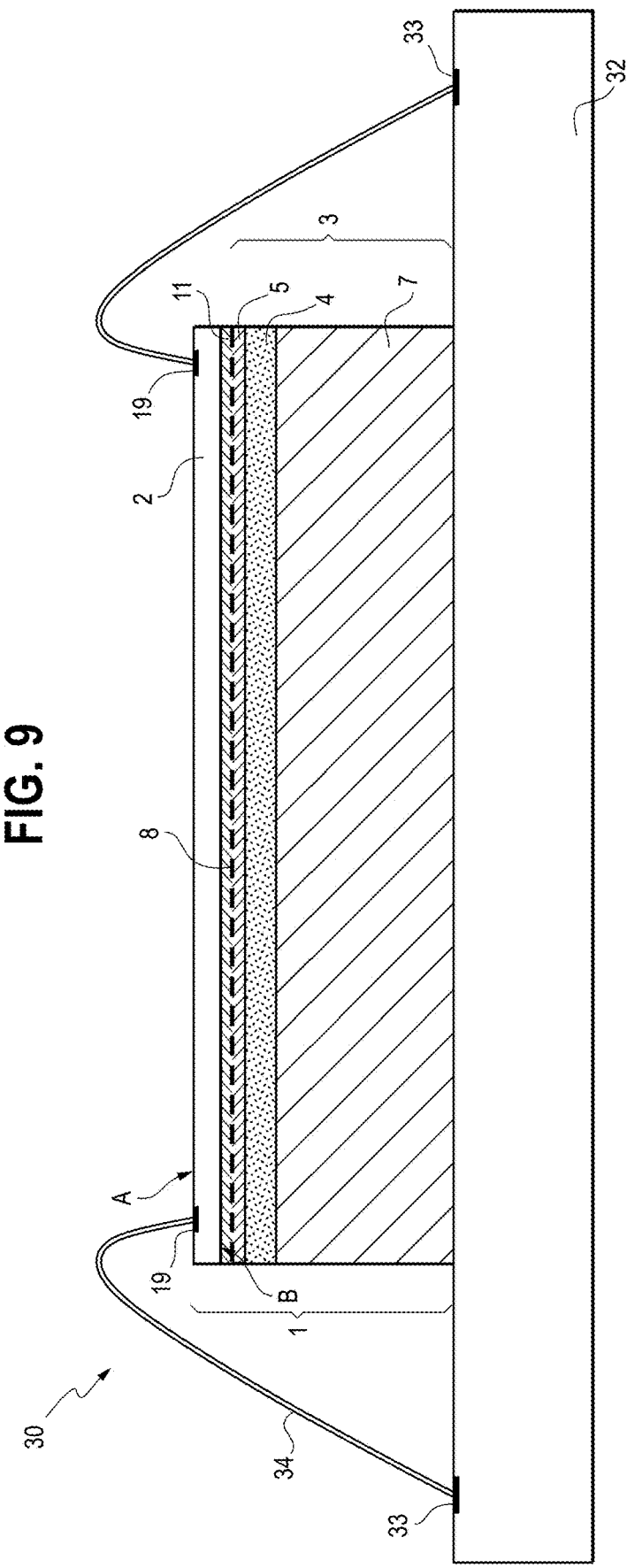
FIG. 9 illustrates an integrated device package in which a bonded structure is mounted and wire bonded to an external device such as a package substrate.

FIG. 9 illustrates an integrated device package 30 in which a bonded structure 1 is mounted to an external device, for example, a package substrate 32. The package substrate 32 can comprise a laminate substrate (such as a printed circuit board, or PCB), a lead frame, a molded lead frame, a ceramic substrate, or any other suitable type of substrate. In the illustrated embodiment, bond pads 19 on the front side A of the semiconductor element 2 are wire bonded to corresponding leads or contact pads 33 on the package substrate 32 by way of one or more bonding wires 34. In FIG. 9, the back side B of the semiconductor element 2 can be protected by the protective element 3 (which includes the obstructive material 4) from external access from the back side B. The semiconductor element 2 shown in FIG. 9 can include an integrated circuit, including semiconductor devices and metallization levels thereover. The protective element 3 can be provided at the wafer level (and thus can be laterally coextensive with the active silicon of the semiconductor element 2 or die) but may not interfere with bonding, including the bonding wires 34 as shown, on the front side A of the semiconductor element 2.

Figure 10:
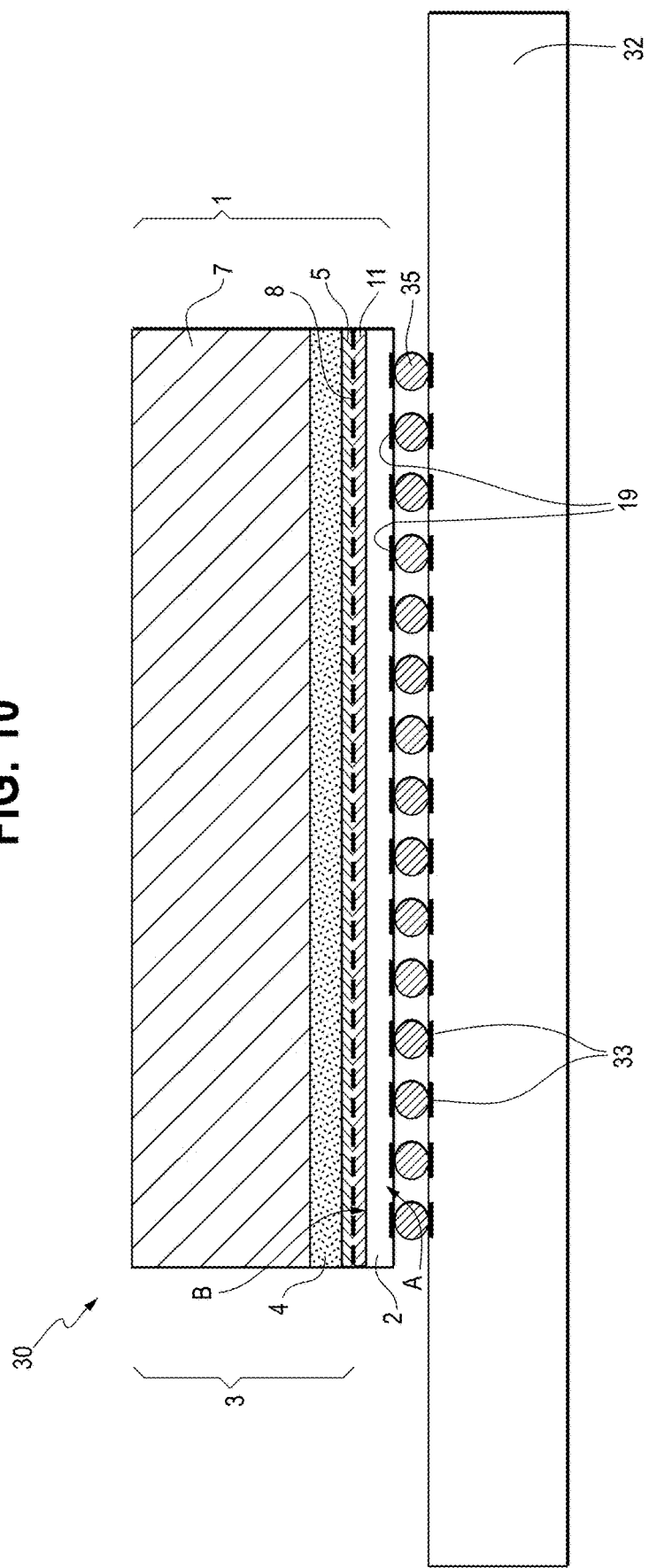
FIG. 10 illustrates an integrated device package in which a bonded structure is mounted and connected to an external device such as a package substrate in a flip chip arrangement, according to another embodiment.

FIG. 10 illustrates an integrated device package 30 in which a bonded structure 1 is mounted to an external device, for example, a package substrate 32, according to another embodiment. As with FIG. 9, the back side B of the semiconductor element 2 can be protected from external access by way of the protective element 3 (which includes the obstructive material 4). Unlike the embodiment of FIG. 9, however, in FIG. 10, the front side A of the semiconductor element 2 may face the external device (e.g., package substrate 32). Bond pads 19 on the front side A of the semiconductor element 2 can be connected to the package substrate 32 by way of a plurality of solder balls 35 in a flip chip connection. As with FIG. 9, the semiconductor element 2 in FIG. 10 can include an integrated circuit, including semiconductor devices and metallization levels thereover. Also, as with FIG. 9, the protective element 3 can be provided at the wafer level (and thus can be laterally coextensive with the active silicon of the semiconductor element 2 or die) but may not interfere with bonding, including the flip chip bonding with solder balls 35 as shown, on the front side A. As noted in FIG. 10, the bonded structure 1 may also include a fan-out arrangement employing a redistribution layer between the active silicon of the semiconductor element 2 and the package substrate 32.

FIGS. 11A and 11B illustrate various embodiments in which both the front side A and the back side B of the semiconductor element 2 can be protected by the protective element 3 with a protective material 4 that can include an obstructive material. FIG. 11A is generally similar to the embodiment of FIG. 9, in which the front side A of the semiconductor element 2 is wire bonded to the package substrate 32. A first protective element 3a (which can include an obstructive material 4) can be provided over the back side B of the semiconductor element 2 as in FIG. 9. Unlike the arrangement of FIG. 9, however, in FIG. 11A, a second protective element 3b (which may be similar to any of the protective elements 3 described herein) can be bonded over the front side A of the semiconductor element 2 to protect the front side A from external attacks on sensitive area(s) 6 of the semiconductor element 2 Thus, in FIG. 11A, sensitive area(s) 6 may be provided at or near one or both of the front and back sides A, B of the semiconductor element 2. Thus, in FIG. 11A, bonding layers can be provided on both the front and back sides A, B of the semiconductor element 2. The first and second protective elements 3a, 3b can be directly bonded to the bonding layers on the front and back sides A, B of the semiconductor element 2 without an adhesive. Unlike FIGS. 5A-5C, the back side obstruction layer 4 can be is integrated with or coupled to the BOX layer of an SOI substrate.

FIG. 11B is generally similar to the embodiment of FIG. 10, in which the front side A of the semiconductor element 2 is connected to the package substrate 32 by way of a flip-chip connection in which a plurality of solder balls 35 electrically and mechanically connect the semiconductor element 2 to the package substrate 32. A first protective element 3a (which can include an obstructive material) can be provided over the back side B of the semiconductor element 2 as in FIG. 10. Unlike the arrangement of FIG. 10, however, in FIG. 11B, a second protective element 3b (which may be similar to any of the protective elements 3 described herein) can be bonded over the front side A of the semiconductor element 2 to protect the front side A from external attacks on sensitive area(s) 6 of the semiconductor element 2 (which may be provided at or near one or both the front and back sides A, B of the element 2). Thus, in FIG. 11B, bonding layers can be provided on both the front and back sides A, B of the semiconductor element 2. The first and second protective elements 3a, 3b can be directly bonded to the bonding layers on the front and back sides A, B of the semiconductor element 2 without an adhesive. As shown in FIG. 11B, the second protective element 3b can be provided in a possum package arrangement in which the second protective element 3b is disposed in a space or cavity 37 between solder balls 35 and above the package substrate 32.

FIG. 12 is a schematic diagram of an electronic system 80 incorporating one or more bonded structures 1, according to various embodiments. The system 80 can comprise any suitable type of electronic device, such as a mobile electronic device (e.g., a smartphone, a tablet computing device, a laptop computer, etc.), a desktop computer, an automobile or components thereof, a stereo system, a medical device, a camera, or any other suitable type of system. In some embodiments, the electronic system 80 can comprise a microprocessor, a graphics processor, an electronic recording device, or digital memory. The system 80 can include one or more device packages 82 which are mechanically and electrically connected to the system 80, e.g., by way of one or more motherboards. Each package 82 can comprise one or more bonded structures 1. The package 82 may be similar to or the same as the packages 30 described herein. The system 80 shown in FIG. 12 can comprise any of the bonded structures 1 and associated protective elements 3 as shown and described herein.

Accordingly, in one embodiment, a bonded structure is disclosed. The bonded structure can include a semiconductor element comprising active circuitry and a first bonding layer. The bonded structure can include an obstructive element directly bonded to the semiconductor element without an adhesive along a bonding interface. The obstructive element can include an obstructive material disposed over the active circuitry and a second bonding layer on the obstructive material. The second bonding layer can be directly bonded to the first bonding layer without an adhesive, the obstructive material having a higher hardness than the semiconductor element and being configured to obstruct external access to the active circuitry.

In some embodiments, the obstructive material can be positioned at a distance less than 10 microns from the bonding interface. For example, the obstructive material can be positioned at a distance less than 5 microns from the bonding interface. A first hardness of the obstructive material can be greater than a second hardness of the semiconductor element. For example, the first hardness can be at least 1.2 times the second hardness, at least 1.25 times the second hardness, at least 1.3 times the second hardness, at least 1.4 times the second hardness, or at least 1.5 times the second hardness. In various embodiments, the first hardness can be in a range of 1.2 to 2.5 times the second hardness, in a range of 1.2 to 2 times the second hardness, or in a range of 1.2 to 1.8 times the second hardness. In some embodiments, the obstructive material can include at least some diamond, and the semiconductor element can comprise at least some silicon. In some embodiments, the obstructive material can comprise destructive material such as an abrasive material. For example, the abrasive material may or may not comprise a continuous solid material. Rather, the abrasive material can comprise particulates of an abrasive material (e.g., silicon carbide, etc.) in a compact area that can create an aggregate in a polishing slurry, which can form the abrasive material. The obstructive material can comprise a destructive material having a hardness in a range of 20 GPa to 150 GPa as measured on the Vickers scale. The obstructive material can comprise a destructive material having a hardness of at least 80 GPa as measured on the Vickers scale. Additionally or alternatively, the obstructive material can comprise a light-blocking material. For example, the light-blocking material can be configured to block light at wavelengths in a range of 700 nm to 1 mm, in a range of 750 nm to 2500 nm, or in a range of 800 nm to 2500 nm. In some embodiments, the light-blocking material can be configured to block light at near infrared (NIR) wavelengths.

In various arrangements, the obstructive material additionally or alternatively can be configured to prevent physical access to the active circuitry. The obstructive material can be configured to physically destroy hardware use for controlled removal of semiconductor material from the bonded structure. The obstructive material can be configured to block electromagnetic waves from reaching the active circuitry.

In some embodiments, the semiconductor element comprises an integrated circuit die. The obstructive element can include a bonding layer between the obstructive material and the semiconductor element. In some embodiments, the bonding layer can comprise silicon oxide. In some embodiments, routing circuitry can extend through the bonding layer to first contact pads of the semiconductor element. A nonconductive routing layer can be disposed between the bonding layer and the obstructive material, with a portion of the routing circuitry disposed along the nonconductive routing layer. Second contact pads of the bonding layer can be directly bonded to corresponding first contact pads of the semiconductor element without an adhesive. In some embodiments, the semiconductor element comprises a second bonding layer directly bonded to the bonding layer.

In various embodiments, the obstructive element further includes a substrate, and the obstructive material comprises an obstructive layer disposed on the substrate. The obstructive layer can be patterned so as to cover less than an entirety of an active surface of the semiconductor element. In some embodiments, the obstructive layer covers an entirety of an active surface of the semiconductor element.

In various embodiments, the obstructive material comprises a chiplet having a bonding layer formed thereon.

In various embodiments, the obstructive element can be directly bonded to a first surface of the semiconductor element. The bonded structure can further comprise a second obstructive element directly bonded to a second surface of the semiconductor element opposite the first surface without an adhesive. The second obstructive element can include a second obstructive material disposed over the active circuitry. The second obstructive material can be configured to obstruct external access to the active circuitry. In some embodiments, the second obstructive element covers only a portion of the second surface of the semiconductor element. In some embodiments, the second obstructive element covers an entirety of the second surface of the semiconductor element.

In various embodiments, a plurality of obstructive elements can be directly bonded to the semiconductor element without an adhesive, with the plurality of obstructive elements including one or more obstructive materials configured to obstruct external access to active circuitry.

In another embodiment, a bonded structure can include a semiconductor element comprising active circuitry and a first bonding layer. The bonded structure can include an obstructive element directly bonded to the semiconductor element without an adhesive along a bonding interface, the obstructive element including an optical obstructive material disposed over the active circuitry and a second bonding layer on the obstructive material, the second bonding layer directly bonded to the first bonding layer without an adhesive, the optical obstructive material configured to obstruct external optical access to the active circuitry.

In some embodiments, the optical obstructive material comprises a light-blocking material. In some embodiments, the light-blocking material is configured to block light at wavelengths in a range of 750 nm to 1500 nm. In some embodiments, the light-blocking material is configured to block light at near infrared (NIR) wavelengths. In some embodiments, the optical obstructive material comprises an optical filter. In some embodiments, the optical obstructive material comprises a light-scattering material.

In another embodiment, a method of forming a bonded structure is disclosed. The method can include directly bonding an obstructive element to a semiconductor element without an adhesive, the semiconductor element comprising active circuitry. The obstructive element can include an obstructive material disposed over the active circuitry, the obstructive material having a hardness higher than the semiconductor element and being configured to obstruct external access to the active circuitry.

In various embodiments, the method can include forming a bonding layer over the obstructive material to form the obstructive element. Forming the bonding layer can comprise depositing an oxide layer on the obstructive material. In some embodiments, contact pads of the bonding layer can be directly bonded to corresponding contact pads of the semiconductor element without an adhesive. Active circuitry can be formed in the semiconductor element. In some embodiments, the active circuitry can be formed before directly bonding. In some embodiments, the active circuitry can be formed after directly bonding.

In various embodiments, the obstructive material can be formed as an obstructive layer on a substrate. In various embodiments, the obstructive material can be printed on a substrate.

In various embodiments, the obstructive element can be singulated before the directly bonding.

In some embodiments, directly bonding the obstructive element can comprise directly bonding a first wafer comprising the obstructive material to a second wafer comprising the semiconductor element. The bonded first and second wafers can be singulated to form a plurality of bonded structures.

In various embodiments, the method can comprise directly bonding a plurality of obstructive elements to the semiconductor element without an adhesive. The plurality of obstructive elements can include one or more obstructive materials configured to obstruct external access to active circuitry.

In some embodiments, the first obstructive element can be directly bonded to a first surface of the semiconductor element. The method can further include directly bonding a second obstructive element to a second surface of the semiconductor element opposite the first surface without an adhesive. The second obstructive element can include a second obstructive material disposed over the active circuitry, the second obstructive material configured to obstruct external access to the active circuitry.

In various embodiments, the method can include forming the obstructive element in a first manufacturing facility and forming the semiconductor element in a second manufacturing facility different from the first manufacturing facility. In some embodiments, the method can include processing the obstructive element at a first maximum temperature and processing the semiconductor element at a second maximum temperature, the first maximum temperature greater than the second maximum temperature. For example, the first maximum temperature can be at least 400° C., or in a range of 400° C. to 1000° C. In various embodiments, the first maximum temperature can be in a range of 1.2 to 4 times the second maximum temperature.

In another embodiment, a method of forming a bonded structure is disclosed. The method can include directly bonding a first bonding layer of a semiconductor element to a second bonding layer of an obstructive element without an adhesive, the semiconductor element comprising active circuitry. The obstructive element can include an optical obstructive material disposed over the active circuitry, the optical obstructive material configured to obstruct external optical access to the active circuitry. In some embodiments, the optical obstructive material is at least one of a light-blocking material, a light-scattering material, and an optical filter.

In another embodiment, a bonded structure is disclosed. The bonded structure can include a semiconductor element including active circuitry. The semiconductor element can have a front side and a back side opposite the front side, with the front side including a plurality of bond pads configured to electrically connect to an external element. The bonded structure can include an obstructive element having an obstructive material formed on the back side of the semiconductor element, with the back side opposite the front side. The obstructive material can be configured to obstruct external access to the active device layer.

In various embodiments, the semiconductor element comprises a first bonding layer on the back side and the obstructive element comprises a second bonding layer, with the first and second bonding layers directly bonded to one another without an adhesive. In some embodiments, the first and second bonding layers comprise silicon oxide. In some embodiments, the active circuitry can be disposed at or near the back side of the semiconductor element. Additionally or alternatively, the active circuitry can be disposed at or near a front side of the semiconductor element.

In some embodiments, the bonded structure can comprise a substrate, with the obstructive element formed on the substrate.

In some embodiments, a first hardness of the obstructive material is greater than a second hardness of the semiconductor element. For example, the first hardness can be at least 1.2 times the second hardness, at least 1.25 times the second hardness, at least 1.3 times the second hardness, at least 1.4 times the second hardness, or at least 1.5 times the second hardness. In various embodiments, the first hardness can be in a range of 1.2 to 2.5 times the second hardness, in a range of 1.2 to 2 times the second hardness, or in a range of 1.2 to 1.8 times the second hardness. In some embodiments, the obstructive material can include at least some diamond, and the semiconductor element can comprise at least some silicon. Additionally or alternatively, the obstructive material can comprise an abrasive material. For example, the abrasive material may or may not comprise a continuous solid material. Rather, the abrasive material can comprise particulates of an abrasive material (e.g., silicon carbide, etc.) in a compact area that can create an aggregate in a polishing slurry, which can form the abrasive material. Additionally or alternatively, the obstructive material comprises a light-blocking material. For example, the light-blocking material can be configured to block light at wavelengths in a range of 750 nm to 2500 nm. In some embodiments, the light-blocking material can be configured to block light at near infrared (NIR) wavelengths. Additionally or alternatively, the obstructive material can comprise a roughened surface, with the second bonding layer disposed on the roughened surface.

In various embodiments, an integrated device package can include the external element and the bonded structure. The external element can comprise a package substrate in some embodiments. The bonded structure can be mounted to the package substrate. In some embodiments, plurality of bond pads can be wire bonded to the package substrate by way of bonding wires. Additionally or alternatively, the plurality of bond pads can be mounted to the package substrate in a flip chip arrangement by way of a plurality of solder balls.

In another embodiment, a method of forming a bonded structure is disclosed. The method can include providing a first bonding layer on a back side of a semiconductor element including active circuitry. The semiconductor element can have a front side opposite the back side. The front side can include a plurality of bond pads configured to electrically connect to an external element. The method can include providing a second bonding layer on an obstructive material. The first and second bonding layers can be bonded to one another. The obstructive material can be configured to obstruct external access to the active circuitry.

In some embodiments, bonding the first and second bonding layers can comprise directly bonding the first and second bonding layers without an adhesive. In some embodiments, the active circuitry can be formed after the directly bonding. In some embodiments, the active circuitry can be formed before the directly bonding.

In various embodiments, the method can include thinning the semiconductor element. The thinning can be performed before the bonding in some embodiments.

In various embodiments, the active circuitry can be formed at or near the front side of the semiconductor element. Additionally or alternatively, the active circuitry can be formed at or near the back side of the semiconductor element.

In various embodiments, the first and second bonding layers form a buried oxide (BOX) layer for a semiconductor-on-insulator (SOI) structure.

In various embodiments, the method can include forming the semiconductor element by growing epitaxial silicon on a silicon substrate. At least a portion of the silicon substrate can be removed after the bonding.

In some embodiments, a packaging method can include mounting the bonded structure to a package substrate and electrically connecting the bonded structure to the package substrate. In various embodiments, the packaging method can include wire bonding the plurality of bond pads to the package substrate. Additionally or alternatively, the method can include electrically connecting the bond pads to the package substrate by way of a plurality of solder balls.

Although disclosed in the context of certain embodiments and examples, it will be understood by those skilled in the art that the present invention extends beyond the specifically disclosed embodiments to other alternative embodiments and/or uses and obvious modifications and equivalents thereof. Further, unless otherwise noted, the components of an illustration may be the same as or generally similar to like-numbered components of one or more different illustrations. In addition, while several variations have been shown and described in detail, other modifications, which are within the scope of this disclosure, will be readily apparent to those of skill in the art based upon this disclosure. It is also contemplated that various combinations or sub-combinations of the specific features and aspects of the embodiments may be made and still fall within the scope of the present disclosure. It should be understood that various features and aspects of the disclosed embodiments can be combined with, or substituted for, one another in order to form varying modes of the disclosed invention. Thus, it is intended that the scope of the present invention herein disclosed should not be limited by the particular disclosed embodiments described above, but should be determined only by a fair reading of the aspects that follow.

What is claimed is:

1. A bonded structure comprising:
   a semiconductor element comprising active circuitry and a first bonding layer; and
   an obstructive element directly bonded to the semiconductor element without an adhesive along a bonding interface, wherein the obstructive element comprises a carrier element, a second bonding layer, and an optically obstructive material on the carrier element, wherein the optically obstructive material is disposed over the active circuitry, and wherein the second bonding layer is directly bonded to the first bonding layer without an adhesive along the bonding interface, the optically obstructive material to obstruct external optical access to the active circuitry.

2. The bonded structure of claim 1, wherein the optically obstructive material comprises a light-blocking material.

3. The bonded structure of claim 2, wherein the light-blocking material blocks light at wavelengths in a range of 750 nm to 1500 nm.

4. The bonded structure of claim 2, wherein the light-blocking material blocks light at wavelengths in a range of 750 nm to 2500 nm.

5. The bonded structure of claim 2, wherein the light-blocking material blocks light at wavelengths in a range of 700 nm to 1 mm.

6. The bonded structure of claim 2, wherein the light-blocking material blocks light at near infrared (NIR) wavelengths.

7. The bonded structure of claim 1, wherein the optically obstructive material comprises an optical filter.

8. The bonded structure of claim 1, wherein the optically obstructive material comprises a light-scattering material.

9. The bonded structure of claim 1, wherein the optically obstructive material comprises a light-filtering material.

10. The bonded structure of claim 9, wherein the optically obstructive material comprises an infrared filter.

11. The bonded structure of claim 1, wherein the second bonding layer comprises silicon oxide.

12. The bonded structure of claim 1, wherein a second dielectric layer of the second bonding layer is directly bonded to a first dielectric layer of the first bonding layer without an adhesive.

13. The bonded structure of claim 12, wherein second contact pads of the second bonding layer are directly bonded to corresponding first contact pads of the semiconductor element without an adhesive.

14. The bonded structure of claim 1, wherein the optically obstructive material is positioned at a distance less than 10 microns from the bonding interface.

15. The bonded structure of claim 1, wherein the optically obstructive material is positioned at a distance less than 5 microns from the bonding interface.

16. A method of forming a bonded structure, the method comprising:
    directly bonding a first bonding layer of a semiconductor element to a second bonding layer of an obstructive element without an adhesive, the semiconductor element comprising active circuitry and the obstructive element comprising the second bonding layer, a carrier element, and an optically obstructive material disposed on the carrier element,
    wherein the optically obstructive material is disposed over the active circuitry, the optically obstructive material to obstruct external optical access to the active circuitry.

17. The method of claim 16, wherein the optically obstructive material is at least one of a light-blocking material, a light-scattering material, and an optical filter.

18. The method of claim 17, wherein the optically obstructive material comprises a light-blocking material that blocks light at wavelengths in a range of 750 nm to 1500 nm.

19. The method of claim 17, wherein the optically obstructive material comprises an optical filter.

20. The method of claim 16, wherein directly bonding comprises hybrid bonding the first bonding layer to the second bonding layer, including forming dielectric-to-dielectric direct bonds and conductor-to-conductor direct bonds.

* * * * *